(12) United States Patent
Ren et al.

(10) Patent No.: US 7,452,452 B2
(45) Date of Patent: Nov. 18, 2008

(54) CARBON NANOTUBE NANOELECTRODE ARRAYS

(75) Inventors: Zhifeng Ren, Newton, MA (US); Yuehe Lin, Richland, WA (US); Wassana Yantasee, Richland, WA (US); Guodong Liu, Fargo, ND (US); Fang Lu, Burlingame, CA (US); Yi Tu, Camarillo, CA (US)

(73) Assignee: The Trustees of Boston College, Chesnut Hill, MA (US)

( * ) Notice: Subject to any disclaimer, the term of this patent is extended or adjusted under 35 U.S.C. 154(b) by 762 days.

(21) Appl. No.: 11/017,480

(22) Filed: Dec. 20, 2004

(65) Prior Publication Data

US 2005/0230270 A1    Oct. 20, 2005

Related U.S. Application Data

(63) Continuation-in-part of application No. 10/424,295, filed on Apr. 28, 2003.

(60) Provisional application No. 60/376,132, filed on Apr. 29, 2002.

(51) Int. Cl.
*G01N 27/30* (2006.01)
*G01N 27/327* (2006.01)

(52) U.S. Cl. .................. 204/400; 204/416; 204/403.01; 977/747; 977/920; 977/957

(58) Field of Classification Search ................ 204/400, 204/403.01, 416; 977/747, 920, 957
See application file for complete search history.

(56) References Cited

U.S. PATENT DOCUMENTS

| | | | |
|---|---|---|---|
| 5,872,422 A | 2/1999 | Xu et al. | 313/311 |
| 6,515,325 B1 * | 2/2003 | Farnworth et al. | 257/296 |
| 6,831,017 B1 * | 12/2004 | Li et al. | 438/694 |
| 2004/0058153 A1 | 3/2004 | Ren et al. | 423/1 |

OTHER PUBLICATIONS

Ren et al., *Synthesis of Large Arrays of Well-Aligned Carbon Nanotubes on Glass*, 1998, Science, vol. 282, pp. 1105-1107.
Sandmann et al., *Preparation of Silver Nanoparticles on ITO Surfaces by a Double-Pulse Method*, 2000, Journal of Electroanalytical Chemistry, vol. 491, pp. 78-86.

(Continued)

*Primary Examiner*—Kaj K Olsen
(74) *Attorney, Agent, or Firm*—Greenberg Traurig, LLP; David J. Dykeman

(57) ABSTRACT

The present invention relates to microelectode arrays (MEAs), and more particularly to carbon nanotube nanoelectrode arrays (CNT-NEAs) for chemical and biological sensing, and methods of use. A nanoelectrode array includes a carbon nanotube material comprising an array of substantially linear carbon nanotubes each having a proximal end and a distal end, the proximal end of the carbon nanotubes are attached to a catalyst substrate material so as to form the array with a pre-determined site density, wherein the carbon nanotubes are aligned with respect to one another within the array; an electrically insulating layer on the surface of the carbon nanotube material, whereby the distal end of the carbon nanotubes extend beyond the electrically insulating layer; a second adhesive electrically insulating layer on the surface of the electrically insulating layer, whereby the distal end of the carbon nanotubes extend beyond the second adhesive electrically insulating layer; and a metal wire attached to the catalyst substrate material.

20 Claims, 25 Drawing Sheets

OTHER PUBLICATIONS

Sotiropoulou et al., *Carbon Nanotube Array-Based Biosensor*, 2003, Anal. Bioanal Chem., vol. 375, pp. 103-105.

Wang et al., *Carbon Nanotube Screen-Printed Electrochemical Sensors*, 2004, The Analyst, vol. 129, pp. 1-2.

Wang et al., *Solubilization of Carbon Nanotubes by Nafion Toward the Preparation of Amperometric Biosensors*, 2003, J. Am. Chem. Soc., vol. 125, pp. 2408-2409.

Yun et al., *Nanowire Growth for Sensor Arrays*, in Proceedings of SPIE vol. 5220 Nanofabrication Technologies, edited by Elizabeth A. Dobisz (SPIE, Bellingham, WA, 2003), pp. 37-45.

Zach et al., *Nanocrystalline Nickel Nanoparticles*, 2000, Advanced Materials, vol. 12, No. 12, pp. 878-883.

Zoval et al., *Electrochemical Deposition of Silver Nanocrystallites on the Atomically Smooth Graphite Basal Plane*, 1996, J. Phys. Chem., vol. 100, pp. 837-844.

Zoval et al., *Electrochemical Preparation of Platinum Nanocrystallites with Size Selectivity on Basal Plane Oriented Graphite Surfaces*, 1998, J. Phys. Chem., vol. 102, pp. 1166-1175.

International Search Report based on PCT/US03/13031 dated Nov. 13, 2003.

Callegari et al., *Functionalized Single Wall Carbon Nanotubes/Polypyrrole Composites for the Preparation of Amperometric Glucose Biosensors*, 2004, J. Mater. Chem., vol. 14, pp. 807-810.

Gao et al., *Glucose Sensors Based on Glucose-Oxidase-Containing Polypyrrole/Aligned Carbon Nanotube Coaxial Nanowire Electrodes*, 2003, Synthetic Metals., vol. 137, pp. 1393-1394.

Huang et al., *Effect of Nickel, Iron and Cobalt on Growth of Aligned Carbon Nanotubes*, 2002, Applied Physics A, vol. 74, pp. 387-391.

Koehne et al., *The Fabrication and Electrochemical Characterization of Carbon Nanotube Nanoelectrode Arrays*, 2004, J. Mater. Chem., vol. 14, pp. 676-684.

Liang et al., *Direct Electrochemistry of Glucose Oxidase at a Gold Electrode Modified with Single-Wall Carbon Nanotubes*, 2003, Sensors, vol. 3, pp. 544-554.

Liu et al., *Size-Selective Electrodeposition of Mesoscale Metal Particles in the Uncoupled Limit*, 2000, J. Phys. Chem., vol. 104, pp. 9131-9139.

Loutfy et al., *Aligned Carbon-Nanotubes for Sensor Applications*, 2002, Perspectives of Fullerene Nanotechnology, pp. 311-316.

Ren et al., *Growth of a Single Freestanding Multiwall Carbon Nanotube on Each Nanonickel Dot*, 1999, Applied Physics Letters, vol. 75, No. 8, pp. 1086-1088.

* cited by examiner

Ni Nanoparticles Made by
Electrochemical Deposition

↓ Aligned CNTs Crowth by PECVD

↓ Coating with SiO₂ and M-Bond

↓ Polishing to Expose the Tip of CNTs

- 200 mV/s
- 1000 mV/s
- 2000 mV/s

CARBON NANOTUBE NANOELECTRODE ARRAYS

RELATED APPLICATION

This application is a continuation-in-part of application Ser. No. 10/424,295, filed Apr. 28, 2003, published as US 2004/0058153, which claims benefit of Provisional Application Ser. No. 60/376,132, filed on Apr. 29, 2002, the entirety of all these application are hereby incorporated by reference.

GOVERNMENT SUPPORT

The invention was supported, in whole or in part, by grant Nos. DE-FG02-00ER45805 and DE-AC05-76RL01830 from The Department of Energy, grant Nos. DAAD16-00-C-9227 and DAAD16-02-C-0037 from The US Army Natick Soldier Systems Center, grant Nos. ECS-0103012 and CMS-0219836 from the National Science Foundation, and by grant Nos. NIH CA-97945-01 and NIH/1R01 ES010976-01A2 from the National Institute of Health. The Government has certain rights in the invention.

FIELD OF THE INVENTION

The present invention relates to microelectode arrays (MEAs), and more particularly to carbon nanotube nanoelectrode arrays (CNT-NEAs) for chemical and biological sensing.

BACKGROUND OF THE INVENTION

Carbon nanotubes (CNTs) have recently attracted attention because of their unique physical properties. CNTs are lightweight and have high mechanical strength, good thermal conductivity, large surface area, and a high aspect ratio. CNTs with variable electronic properties can be obtained by introducing chirality (the rotation of the symmetry of carbon network along the cylinder axis) in individual tubules, whereby the electronic properties may be varied as a function of their chirality. CNTs have superior electron emitting properties compared to conventional materials. Typical field enhancement factors ranging between 30,000 and 50,000 can be obtained for individual CNT tubules, and between 1,000 and 3,000 for CNT arrays. The field enhancement factors of CNT arrays are much smaller than those for individual CNT tubules to the presence of a planar substrate that is necessarily required for physically supporting the CNT tubules forming an array. The field enhancement factors of dense CNT arrays (large number of CNT tubules per unit area substrate) are even smaller because the electrical field around one tubule is screened by neighboring tubules due to their close proximity.

Utilizing CNTs for nanoelectrode arrays (NEAs) has not been accomplished in the art. NEAs consisting of hundreds of metal microelectrodes (MEs) with diameter of several micrometers (μm) have been fabricated by lithographic techniques. NEAs show many advantages over the conventional macroelectrodes. For example, NEAs have high mass sensitivity, increased mass transport and the decreased influence of solution resistance. However, present NEAs are limited by their poor detection limits and low signal-to-noise (S/N) ratio. Noise level depends on the active surface area of the individual electrode whereas the signal depends on the total surface area of all electrodes. Present NEAs have an inadequate number of electrodes per unit area for offering acceptable S/N ratios. Increasing the number of electrodes per unit area will therefore result in an increase in the S/N ratio and improve detection limits. Arrays of vertically aligned CNTs have the good material properties and size (about 20 nm to about 200 nm) for NEAs, but do not have the needed inter-tubule distances within the array (site density), although they still show many advantages over the conventional macroelectrodes. The spacing between individual CNT tubules needs to be sufficiently large in comparison with the diameter of the individual CNT tubules to make each CNT tubule work as an individual nanoelectrode. Reducing the size of each individual electrode to nanometer scale and increasing the total number of electrodes per unit area should improve detection limits and S/N ratio.

For aligned CNTs, tuning of CNT characteristics such as diameter, length and inter-tubule distances within the array (site density) is important for certain electrical and electronic applications, such as field emission and nanoelectrode arrays, due to the shielding effect in a dense array. Since the field enhancement of carbon nanotube film is affected by the length of carbon nanotubes and the spacing between them, it is important to characterize the effect of length and spacing on field emission properties in order to obtain a high and uniform field emission current at low electric field. The effect of length and spacing is known for randomly oriented CNT films and vertically aligned carbon nanotube films. The utility of such randomly oriented CNT films is limited because CNT tubule length, CNT tubule diameter, and CNT tubule spacing cannot be independently varied, so that effect of CNT tubule length, CNT tubule diameter, and CNT tubule spacing (site density) on field enhancement, were not clearly independent. The independent control of such parameters which is important for field enhancement, is therefore not possible using the methods known in the art.

Syntheses of CNTs wherein the individual tubules are organized in a random or aligned manner are known in the art. Although tubule diameter and tubule length of aligned CNTs have been controlled by controlling site densities, catalyst particle size and the growth time, respectively, such methods have been unsuccessful in controlling CNT densities. Furthermore, the present methods which attempt to reduce catalytic site density by electron beam lithography, photolithography, micro contact printing, and shadow mask techniques have limited utility especially in terms of commercial viability since they require expensive equipment, are labor intensive, do not achieve uniform site density control over large areas, and are not amenable to incorporation into large-scale production processes.

There is therefore a need for obtaining aligned CNT arrays with controllable site densities over relatively larger surface areas.

SUMMARY OF THE INVENTION

In one aspect, the present invention provides carbon nanotube (CNT) materials comprising arrays of substantially linear carbon nanotubes with controllable site densities having superior electrical properties for electrode fabrication for use in applications such as metal ion detection in environmental analysis devices and as biosensors. In particular the present invention provides a CNT materials comprising arrays of substantially linear CNTs with controllable site densities wherein the arrays are attached to a catalyst substrate material, wherein the carbon nanotubes are aligned with respect to one another within the array.

In another aspect, the present invention also provides methods of making carbon nanotube (CNT) materials comprising arrays of substantially linear carbon nanotubes with controllable site densities. In particular the present invention provides control of site density of CNTs in the aligned CNT arrays of the invention. Control of site density is accomplished by control of the density of the catalytic sites, such as catalytic transition metal microparticles, within a catalyst substrate material. In one embodiment, CNT growth initiated on such catalytic substrate materials provides linear CNT arrays that are aligned and have a pre-determined intertubule distance (site density) that are controlled by the density of catalytic transition metal microparticles within.

In another aspect, the present invention also provides catalyst substrate materials comprising a non-metallic material having deposited thereupon a layer of a metallic material, and a plurality of catalytic transition metal microparticles deposited upon the metallic material with pre-determined densities (site densities).

In another aspect, the present invention also provides methods of making catalyst substrate materials, comprising catalytic nucleation sites per unit area of catalyst substrate surface area (site density), which is controlled by control of the size and density of the catalytic transition metal microparticles.

In one embodiment, the site density of catalytic nucleation sites that include one or more types of catalytic transition metal microparticles that are capable of initiating CNT growth, wherein the number of catalytic transition metal microparticles is varied by pulse current electrochemical deposition (PCED). The nucleation site density and the size of the catalyst metal microparticles are controlled by adjusting the amplitude of the pulse current and duration and electrolyte concentration. In a preferred embodiment, the density of catalytic transition metal microparticles is up to $10^9$ cm$^{-2}$. In another preferred embodiment, the density of catalytic transition metal microparticles is up to $10^{12}$ cm$^{-2}$. The catalyst material comprising catalytic nucleation sites created by the catalytic transition metal microparticles are utilized for the preparation of aligned CNTs having pre-determined site densities. CNT growth on the catalytic substrate materials of the invention is initiated by known methods such as for example chemical vapor deposition (CVD). In a currently preferred embodiment, the aligned CNTs with controlled site densities are prepared by using a Plasma Enhanced Chemical Vapor Deposition (PECVD) process. The site density of the aligned CNT arrays of the invention is determined by the site density of the catalytic nucleation sites in the catalyst substrate material, which in turn, is controlled by the site density of the catalytic transition metal microparticles. Pulse current electrochemical deposition of the invention is a relatively inexpensive and effective technique, and is readily scalable over larger areas, for example, tens of linear inches of catalyst substrate material.

In another aspect, the present invention also provides fabrication of electrically conductive thin films with variable field emission characteristics comprising the vertically aligned pre-determined site density CNT arrays, whereby the field emission property of the conductive films is controlled by independently varying either the length of CNT tubules within the aligned arrays forming the film, or the inter-tubule spacing of the individual CNTs within the array (site density). In particular, the present invention provides a method of controlling the shielding effect between individual tubules for field emission devices and microelectrode fabrication. In another aspect, the field emission characteristics of conductive films comprising vertically aligned CNT are compared following the independent variation of the length and the spacing of the CNTs. The macroscopic electric field $E_{mac,1}$ at the current density of 1 mA/cm$^2$ is used as a criterion for the comparison. For a given length of carbon nanotubes, $E_{mac,1}$ is decreased as the spacing of carbon nanotubes are increased, and for a given spacing of carbon nanotubes, $E_{mac,1}$ is decreased as the length of carbon nanotubes are increased except for the very high density carbon nanotube film. It is estimated that $E_{mac,1}$ is nearly saturated to be about 3 V/μm when the site density is lower than about $10^6$ cm$^{-2}$ and the length is longer than about 10 μm.

In another aspect, the present invention also provides nanoelectrode arrays (NEAs) comprising CNT materials and method of their production. In particular the present invention provides nanroelectrode arrays (NEAs) comprising an array of substantially linear CNTs with controllable site densities wherein the arrays are attached to a catalyst substrate material, wherein the carbon nanotubes are aligned with respect to one another within the array.

CNTs can be utilized as carbon electrodes that have a wide useful potential range, particularly in the positive direction due to the slow kinetics of carbon oxidation. CNTs can undergo various chemical and electrochemical modifications to produce flexible surfaces to influence reactivity. CNT electrodes can be utilized in both fundamental and applied electrochemistry due to their unique properties such as high aspect ratio and good electrical conductivity.

Catalyst microparticles need to be stable in a plasma environment during carbon nanotubes growth. Therefore, catalyst microparticles should necessarily have a relative large size. There is a need to make large diameter catalyst microparticles on a fairly large area having a low site density.

The present invention provides a nanoelectrode array comprising: a carbon nanotube material comprising an array of substantially linear carbon nanotubes each having a proximal end and a distal end, the proximal end of the carbon nanotubes are attached to a catalyst substrate material to form the array with a pre-determined site density, wherein the carbon nanotubes are aligned with respect to one another within the array; an electrically insulating layer on the surface of the carbon nanotube material, whereby the distal end of the carbon nanotubes extend beyond the electrically insulating layer; a second adhesive electrically insulating layer on the surface of the electrically insulating layer, whereby the distal end of the carbon nanotubes extend beyond the second adhesive electrically insulating layer; and a metal wire attached to the catalyst substrate material.

The present invention provides a nanoelectrode array for the selective detection of glucose comprising: a carbon nanotube material comprising an array of substantially linear carbon nanotubes each having a proximal end and a distal end, the proximal end attached to a catalyst substrate material to form the array with a pre-determined site density, and a carboxylic acid group functionalized to the distal end of the carbon nanotubes, wherein the carbon nanotubes are aligned with respect to one another within the array; an electrically insulating layer on the surface of the carbon nanotube material, whereby the distal end of the carbon nanotubes extend beyond the electrically insulating layer; a second adhesive electrically insulating layer on the surface of the electrically insulating layer, whereby the distal end of the carbon nanotubes extend beyond the second adhesive electrically insulating layer; and a metal wire attached to the catalyst substrate material, wherein the carboxylic acid group attached to the distal end of the carbon nanotubes is coupled to a glucose oxidase enzyme for the selective detection of glucose.

The present invention provides a method for detecting an amount of a metal ion in an aqueous solution comprising: providing an array of substantially linear carbon nanotubes, each of the carbon nanotubes having a proximal end attached to a surface of a catalyst substrate material that has at least one electrically insulating layer on the surface as well as a metal wire attached to the surface of the substrate and a distal end that is exposed; providing a reference and auxiliary electrode; introducing the aqueous solution comprising a metal ion to the array of substantially linear carbon nanotubes; measuring an amperometric response of the array of substantially linear carbon nanotubes to the aqueous solution; and detecting the amount of metal ion in the aqueous solution.

The present invention provides a method for detecting an amount of glucose in a test sample comprising: providing an array of substantially linear carbon nanotubes, each of the carbon nanotubes having a proximal end attached to a surface of a catalyst substrate material that has at least one electrically insulating layer on the surface as well as a metal wire attached to the surface of the substrate and a functional group and enzyme for detecting glucose attached to a distal end of each of the carbon nanotubes; providing a reference and auxiliary electrode; introducing a test sample comprising a solution of glucose to the array of substantially linear carbon nanotubes; measuring an amperometric response of the array of substantially linear carbon nanotubes to the test sample; and detecting the amount of glucose in the test sample.

BRIEF DESCRIPTION OF THE DRAWINGS

FIG. 1 shows SEM images of nickel (Ni) microparticles deposited electrochemically.

FIG. 2 shows SEM images of aligned CNTs having various site densities of CNTs grown from electrodeposited Ni microparticles. FIGS. 2(a)-2(e) are shown on a scale of 10 micrometers (μm). FIG. 2(f) is shown on a scale of 1 μm.

FIG. 3 shows images of CNTs of the present invention.

FIG. 5 shows SEM micrographs of CNT arrays with varying site densities. The SEM micrographs are shown at a grazing incidence of 45° to the substrate.

FIG. 10 shows a fabrication scheme for a site density controlled CNT nanoelectrode array.

FIG. 11 shows SEM images of the fabrication steps of the nanoelectrode array, FIG. 11(a) shows electro-deposited Ni microparticles. FIG. 11(b) shows a low site density aligned CNTs array. FIG. 11(c) shows a CNT array coated with a SiO$_2$ and an epoxy layer. FIG. 11(d) shows a magnified view of a single half embedded CNT, FIG. 11(e) shows CNTs after polishing. FIG. 11(f) shows a second electrodeposition of Ni microparticles on the polished CNTs only.

FIG. 14 shows a cyclic voltammetry curve of a CNT nanoelectrode array of the present invention.

FIG. 18 shows square wave voltammetry characteristics of a CNT nanoelectrode array of the present invention.

FIG. 19 shows the voltammetric response (current) of $Pb^{2+}$ in 0.1 M $NaNO_3$ solution.

DETAILED DESCRIPTION OF THE INVENTION

Figure 1A:
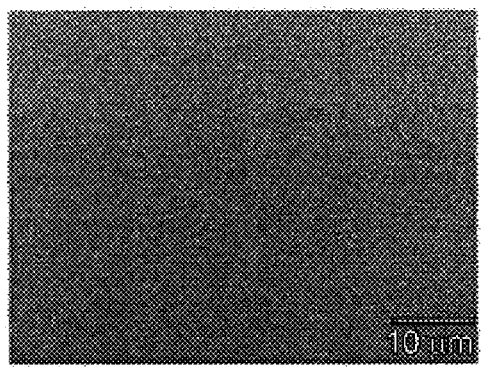
FIG. 1(a) shows a site density of $7.5 \times 10^5$ cm$^{-2}$.
Figure 1B:
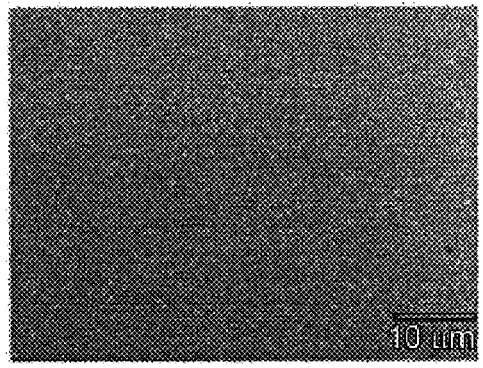
FIG. 1(b) shows a site density of $2.0 \times 10^6$ cm$^{-2}$.
Figure 1C:
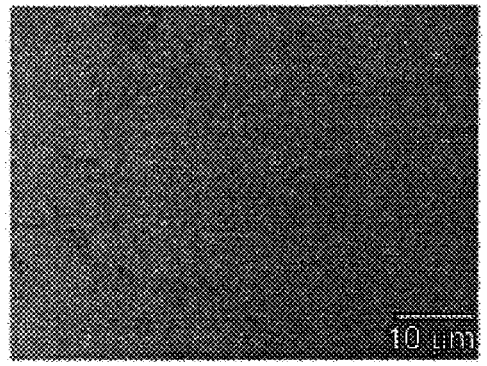
FIG. 1(c) shows a site density of $2.0 \times 10^7$ cm$^{-2}$.
Figure 1D:
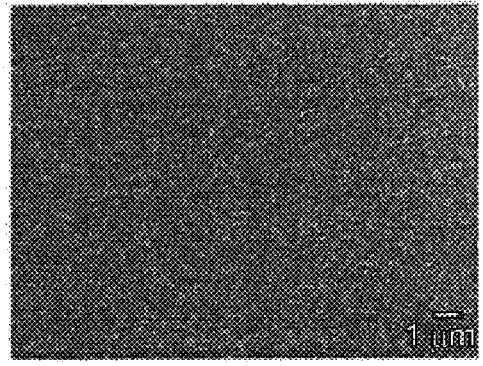
FIG. 1(d) shows a site density of $3.0 \times 10^8$ cm$^{-2}$. The white dots shown in the images are the nickel (Ni) microparticles confirmed by Energy Dispersive X-ray Spectroscopy (EDX).
Figure 2A:
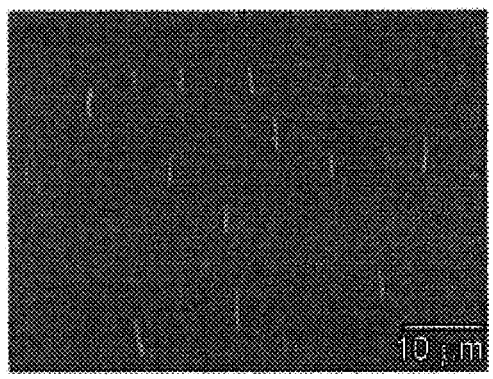
FIGS. 2(a) shows a site density of $7.5 \times 10^5$ cm$^{-2}$.
Figure 2D:
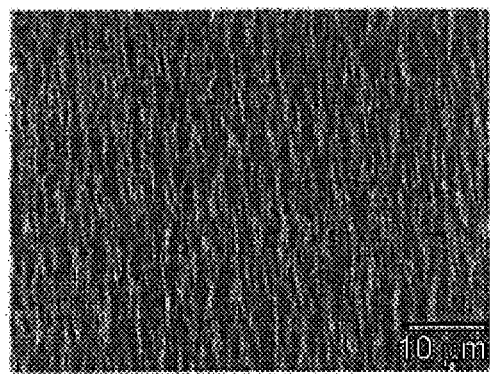
FIG. 2(d) shows a site density of $2.0 \times 10^7$ cm$^{-2}$.
Figure 2B:
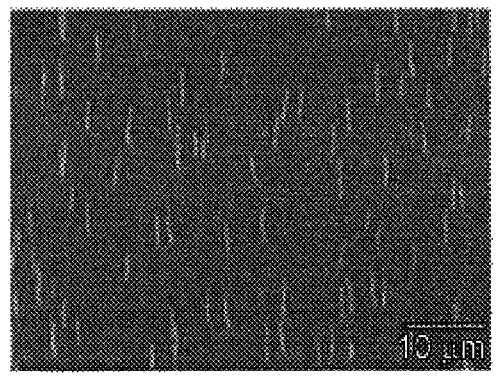
FIG. 2(b) shows a site density of $2.0 \times 10^6$ cm$^{-2}$.
Figure 2E:
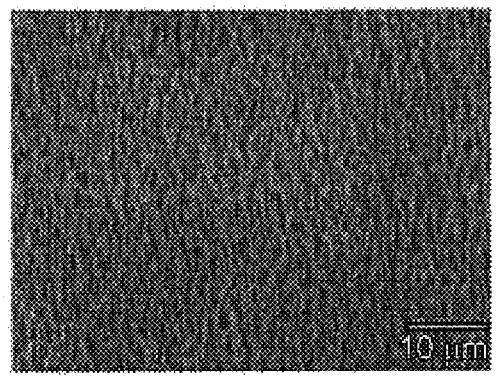
FIG. 2(e) shows a site density of $3.0 \times 10^8$ cm$^{-2}$.
Figure 2C:
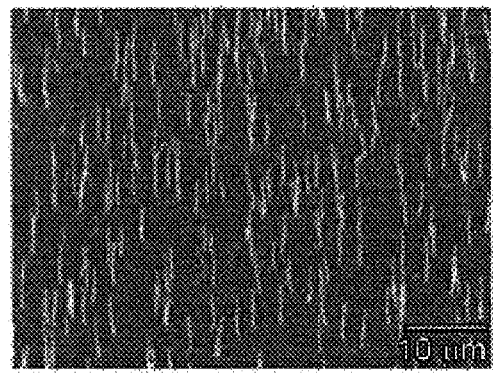
FIG. 2(c) shows a site density of $6.0 \times 10^6$ cm$^{-2}$.
Figure 2F:
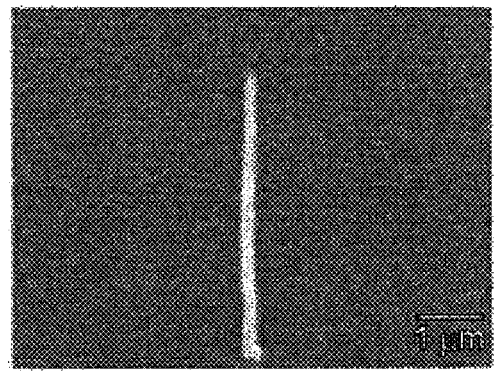
FIG. 2(f) is an enlarged view a single standing aligned CNT.

The following definitions are used to describe the various aspects and characteristics of the invention.

As referred to herein CNTs are "aligned" wherein the longitudinal axis of individual tubules are oriented in a plane substantially parallel to one another.

As referred to herein CNTs have a "uniform length" wherein the wherein the length of individual tubules are substantially the same length relative to one another. Depending on growth conditions used, the height of a CNT in an array in a given growth run can be varied in height by about 10% to about 50%. Alternatively, height uniformity is accomplished by performing additional mechanical polish steps. In a preferred embodiment, the CNTs have a uniform length from about 1 to about 50 micrometers. In a particularly preferred embodiment, the CNTs have an average length of about 8 micrometers.

As referred to herein "density" or "site density" denotes units of microparticles or CNT tubules per centimeter squared ($cm^{-2}$). Site density relates the spacing distance between individual microparticles or CNT tubules in an array. For example, a density of about $1×10^6$ $cm^{-2}$ corresponds to a spacing distance of about 10 micrometers (μm) As referred to herein "high site density" is a large number of nanoparticle or CNT tubule units per centimeter squared ($cm^{-2}$). Typically a high site density refers to a number greater than about $1.0×10^{12}$ $cm^{-2}$.

As referred to herein "low site density" is a small number of nanoparticle or CNT tubule units per centimeter squared ($cm^{-2}$). Typically a low site density refers to a number less than or equal to about $1.0×10^{12}$ $cm^{-2}$.

As referred to herein, a "tubule" is an individual CNT.

As referred to herein, the "aspect ratio" of a CNT is the ratio of tubule length and tubule diameter.

The CNTs as refers to herein have "proximal" and "distal" ends. The proximal ends of the CNTs are attached to a catalyst substrate material.

The term "Linear CNTs" as defined herein, refers to CNTs that do not contain any branches originating from the surface of individual CNT tubules along their linear axes.

The term "Array" as used herein, refers to a plurality of CNT tubules that are attached to a substrate material proximally to one another.

As referred to herein, a "non-metallic material" is any non-conductive material suitable for depositing a metallic layer thereupon. Examples of "non-metallic material" polymers include but are not limited to, silicon, silica, glass, alumina, quartz, polymer and graphite. Examples of polymers include but are not limited to, polyvinyl chloride (PVC), polyacrylate (PA), polypropylene (PP), polymethylmethacrylate (PMMA), polycarbonate (PC) polyethylene (PE) and thermoset plastics. In a preferred embodiment, the non-metallic material is a silicon wafer.

As referred to herein, a "metallic material" can be a metal, metal alloy or mixture thereof. Examples of a metallic material include, but are not limited to, chromium (Cr), molybdenum (Mo), tungsten (W), ruthenium (Ru), copper (Cu), silver (Ag) and gold (Au). In a preferred embodiment, the metallic material is chromium (Cr).

As referred to herein, a "catalytic transition metal" can be any transition metal, transition metal alloy or mixture thereof. Examples of a catalytic transition metal include, but are not limited to, nickel (Ni), silver (Ag), gold (Au), platinum (Pt), palladium (Pd), iron (Fe), ruthenium (Ru), osmium (Os), cobalt (Co), rhodium (Rh) and iridium (fr). In a preferred embodiment, the catalytic transition metal comprises nickel (Ni).

As referred to herein, a "catalytic transition metal alloy" can be any transition metal alloy. Preferably, a catalytic transition metal alloy is a homogeneous mixture or solid solution of two or more transition metals. Examples of a catalytic transition metal alloy include, but are not limited to, a nickel/gold (Ni/Au) alloy and a cobalt/iron (Co/Fe) alloy.

"Pulse-Current Electrochemical Deposition" (PCED) is an electrochemical deposition process which utilized a modulated current waveform (a current pulse). PCED can be used to achieve superior leveling of the deposit, and to minimize porosity and contamination. PCED is performed by applying a constant current pulse by using a current source and a voltage source. Both the current source and the voltage source are controlled by any suitable means known in the art including analog and digital controller devices. In a preferred embodiment, the current source and the voltage source is controlled by a computer.

As referred to herein, a "working electrode" is a metallic coated non-metallic substrate for use in depositing a catalytic transition metal. Preferably the working electrode is a chromium (Cr) coated silicon (Si) wafer. The chromium (Cr)

coating provides a flat, conductive and defect free surface on the silicon (Si) wafer. A preferred method of preparing a chromium (Cr) coated silicon (Si) wafer comprises sputtering a layer of chromium (Cr) on a silicon (Si) wafer. Preferably the sputtering method is magnetron sputtering.

As referred to herein, a "counter electrode" is any suitable electrically-conductive metal. In a preferred embodiment, the counter electrode comprises a noble metal. Examples of suitable noble metals include, but are not limited to, gold (Au), platinum (Pt) and iridium (Ir). In a particularly preferred embodiment, the counter electrode is gold (Au) plate.

As referred to herein, an "electrolytic solution." comprises a transition metal salt and a mineral acid. Preferably, the transition metal salt is a transition metal sulfate. In a preferred embodiment, the transition metal sulfate is nickel sulfate ($NiSO_4$). Examples of suitable mineral acids include but are not limited to boric acid ($H_3BO_3$), nitric acid ($HNO_3$), hydrochloric acid (HCl) and sulfuric acid ($H_2SO_4$). Preferably the electrolytic solution is weekly acidic. In a preferred embodiment, the mineral acid is boric acid ($H_3BO_3$). In a currently preferred embodiment, the electrolytic solution comprises 0.01 M nickel sulfate ($NiSO_4$) and 0.01 M boric acid ($H_3BO_3$) in double distilled water.

The term "CVD" refers to chemical vapor deposition. In CVD, gaseous mixtures of chemicals are dissociated at high temperature (for example, $CO_2$ into C and $O_2$). This is the "CV" part of CVD. Some of the liberated molecules may then be deposited on a nearby substrate (the "D" in CVD), with the rest pumped away. Examples of CVD methods include but not limited to, "plasma enhanced chemical vapor deposition" (PECVD), "hot filament chemical vapor deposition" (HFCVD), and "synchrotron radiation chemical vapor deposition" (SRCVD).

As referred to herein, a "promoter gas" component of the of the invention can be a substance that is a gaseous compound at the reaction temperatures, and preferably comprises a non-carbon gas such as ammonia, ammonia-nitrogen, hydrogen, thiophene, or mixtures thereof. The promoter gas of the present invention may be diluted by mixing it with a diluent gas, which are primarily unreactive, oxygen-free gases, such as for example, hydrogen, helium, nitrogen, argon, neon, krypton, xenon, hydrogen sulfide, or combinations thereof. For the CVD reaction process of the present invention, hydrogen is preferred for reaction temperatures maintained at less than about 700° C., while for higher temperatures (greater than or equal to about 700° C.), the promoter gas is chosen from ammonia, hydrogen, nitrogen, or any combination thereof. The promoter gas can be introduced into the reaction chamber of the reaction apparatus (e.g. the CVD reaction chamber) at any stage of the reaction process. Preferably, the promoter gas is introduced into the reaction chamber either prior to or simultaneously with the carbon source gas. The CNT nanotube nucleation process on the catalyst substrate is catalyzed by the promoter gas of the present invention enables every metal catalyst "cap" that is formed within individual tubules to catalyze their efficient and rapid growth.

As referred to herein, a "carbon source gas" of the present invention can be saturated, unsaturated linear branched or cyclic hydrocarbons, or mixtures thereof, that are in either in the gas or vapor phase at the temperatures at which they are contacted with the catalyst substrate material (reaction temperature). Preferred carbon source gases include methane, propane, acetylene, ethylene, benzene, or mixtures thereof. In a currently preferred embodiment, the carbon source gas for the synthesis of linear CNTs is acetylene.

As referred to herein, an "insulator" can be any a non-conducting or insulating material. Preferably, the insulator has a low porosity, a high density and is substantially defect free. Examples of an insulator include high-density polymers, and metal oxides. In a preferred embodiment, the insulator is silicon dioxide ($SiO_2$).

As referred to herein, an "adhesive" can be a non-conducting or insulating bonding material. Examples of a non-conducting bonding material include, but are not limited to, epoxy resins, glue gums, cementing agents, etc. In a preferred embodiment, the non-conducting bonding material is an epoxy resin. In a particularly preferred embodiment, the epoxy resin is a two-component, solvent-thinned, epoxy-phenolic adhesive (M-Bond 610™). In another particularly preferred embodiment, the epoxy resin is a bisphenol A/ epichorohydrin derived liquid epoxy resin (Epon resin 828™) (Miller-Stephenson Chemical Company, Inc.).

In one aspect, the present invention relates to a CNT material comprising an array of substantially linear carbon nanotubes with controllable site densities, wherein the individual tubules within the arrays are attached to a catalyst substrate material, in a manner as to be aligned with respect to one another within the array. In one embodiment, the CNT material comprises an array of substantially linear carbon nanotubes with pre-determined densities that are attached to a catalyst substrate material, wherein the carbon nanotubes are aligned with respect to one another within the array.

In another aspect, the present invention relates to a catalyst substrate material whereupon the CNT material is produced. In one embodiment, the catalyst substrate material comprises a non-metallic material having deposited thereupon a layer of a metallic material, and a plurality of catalytic transition metal microparticles deposited upon the metallic material with pre-determined densities.

Another aspect of the invention relates to a method of forming a catalyst substrate material comprising a non-metallic material having deposited thereupon a layer of a metallic material, and a plurality of catalytic transition metal microparticles deposited upon the metallic material with pre-determined densities. In one embodiment, the catalytic transition metal microparticles deposited upon the metallic material using.

Many factors with PCED can affect the deposited microparticles, including the composition of the electrolyte solution; the surface morphology of the substrate; the magnitude of the applied pulse current density and the duration time. Lowering the concentration of transition metal ions will decrease both the nucleation site density and the size of the deposited catalytic transition metal microparticles.

Varying mineral acid concentrations, such as boric acid concentrations, changes the pH value. Solutions with a support electrolyte (potassium chloride) added are tested and it is found only when the concentration of mineral acid is very low and no other support electrolyte is added, the catalytic transition metal microparticles with low site density and large size (larger than 100 nm in diameter) are achieved. When the mineral acid concentration increases or some other support electrolyte is added, the conductivity of the solution increases, and the electrodeposited catalytic transition metal microparticles have higher density and smaller size. The surface morphology of the substrate also affects the distribution of the deposited catalytic transition metal microparticles. Microparticles form easily on the defect site of the substrate with high site density. In order to eliminate the aggregation of the microparticles, a sputtering method is used to coat a thin layer of metallic material such as chromium (Cr) on the non-metallic substrate material such as a silicon (Si) wafer to obtain a conductive and defect free surface.

When the solution composition and the substrate are fixed, the site density and the size of the transition metal microparticles are determined by the combined effect of applied pulse current density and duration time. High current density and long duration time result in high site density and large particles (greater than about 100 nm).

In one embodiment, the size distribution of the electrochemical deposited catalytic transition metal microparticles is quite large. Both large particles (greater than about 100 nm) and small particles (less than about 50 nm) are deposited on the substrate. The small particles are removed by plasma etching before the growth of CNTs.

In another embodiment, PCED is performed by applying a constant current pulse to a two electrode system comprising a working electrode and a counter electrode. The working electrode and the counter electrode are spaced at a suitable distance. In a preferred embodiment, the two electrodes are spaced at suitable distances, typically of about 1 cm. PCED is performed at any suitable temperature. In a preferred embodiment, the PCED is performed at room temperature.

In a preferred embodiment, PECD is carried out on a two electrode system, wherein the distance between the two electrodes is maintained at about 1 cm, and a constant current pulse is applied by using a current source and a voltage source, both of which are controlled by the computer program. The working electrode is prepared by sputtering a layer of chromium on a silicon wafer thereby obtaining a flat, conductive and defect free surface. Gold plate is used as counter electrode. About 1 cm$^2$ of the working electrode surface is exposed to a weekly acidic electrolyte solution comprising 0.01 M $NiSO_4$ (0.01M $Ni^{2+}$) and 0.01 M $H_3BO_3$ in double distilled water at room temperature.

Another aspect of the invention relates to a method of forming a CNT material comprising an array of substantially linear carbon nanotubes with pre-determined densities that are attached to a catalyst substrate material, wherein the CNTs are aligned with respect to one another within the array.

CNTs can be grown by any suitable method known in the art. For example, CNTs can be grown by any chemical vapor deposition (CVD) method, including but not limited to, plasma enhanced chemical vapor deposition (PECVD), hot filament chemical vapor deposition (HFCVD) or synchrotron radiation chemical vapor deposition (SRCVD). It has been discovered that CNT tubules with substantially improved alignment can be obtained by the methods of invention by inclusion of a plasma during the CNT growth process. In a preferred embodiment the CNTs are grown from the transition metal microparticles by a PECVD process.

In one embodiment, CNTs of the present invention are obtained by placing a catalyst substrate material, which is formed by electrochemical deposition of a catalytic transition metal microparticles, with a pre-determined site density, on a metal coated non-metallic substrate material, within a PECVD chamber known in the art, following which CNT growth is initiated on the surface of the catalyst substrate material by standard methods described in the art. (see for example Z. F. Ren, et al., Science, 282, 1105 (1998); Z. P. Huang, et al., Appl. Phys. A: Mater. Sci. Process, 74, 387 (2002); and Z. F. Ren et al., Appl. Phys. Lett., 75, 1086 (1999), the contents of which are incorporated herein by reference in their entirety).

CNT tubule diameter, tubule length, number of concentric graphene layers (graphitization) comprising individual tubules and the yield of the CNTs is controlled by varying the reaction temperature of CNT synthetic process.

Production of linear CNT materials is accomplished by placing a catalysts substrate into the reaction chamber of a CVD apparatus and exposed to a flow of a gas mixture containing the carbon source gas and a promoter gas. The reaction temperature, gas pressure and reaction time are maintained under pre-determined conditions effective to cause formation and growth of a plurality of carbon nanotubes on the catalyst substrate surface. The CVD chamber temperature and gas pressure are optimized to control and obtain the desired the morphology of carbon nanotubes during their growth.

The catalyst substrate material can be used in the CNT synthetic process either by itself to cause reaction of the carbon source gas, or in combination with the promoter gas that is mixed with the carbon source gas.

The manufacturing methods of the invention also enable the tailoring of linear CNT morphology by controlling gas pressure. At relatively low pressures, CNTs with a tubular hollow structure can be obtained, whereas at relatively high pressures, CNTs with "bamboo-like" structure and increased compartmental density can be obtained. The number of graphene layers, which is related to thickness of the tubule wall and diaphragm of the CNTs, can also be controlled during their formation by control of gas pressure. Once the first layer forms as a bamboo-like structure, all subsequent layers terminate on the surface of the CNT.

The methods of the present invention allow the process parameters for catalyst substrate material and CNT formation to be varied optimally, thereby enabling controllable formation of catalyst substrate materials and CNTs with pre-determined site densities and morphologies.

In the PECVD method, the transition metal microparticles are subjected to the plasma. Plasma is utilized to direct the CNTs growth direction.

In one embodiment, the catalyst substrate is optionally etched prior to CNT growth to substantially reduce the number of transition metal microparticles that have a diameter smaller than 50 nanometers. The plasma etches the catalyst substrate and at the same time assists the CNT growth.

The morphology of the CNTs is related to the size of the transition metal microparticles. When the diameter of the transition metal microparticles is smaller than 50 nanometers, either no CNTs or only short and curved CNTs are grown. When the size of the transition metal microparticles is large, well-aligned CNTs with uniform length distribution are grown. As stated above, both small and large transition metal microparticles are presented on the substrate after electrochemical deposition. In order to substantially eliminate the small particles, an optional etching step is preformed by applying low intensity plasma to the substrate for a short time before the introduction of acetylene gas. In a preferred embodiment, the catalyst substrate is etched by applying 100 Watts of direct current (DC) plasma is for about 10 to about 20 seconds. After the etching, the small particles are removed and the other large particles become smaller.

In one embodiment, a catalytic substrate, formed by PECD of Ni microparticles, is placed in a PECVD chamber. The pressure in the chamber is reduced to $2 \times 10^{-6}$ Torr, then about 160 standard cubic centimeter per minute (sccm) ammonia ($NH_3$) gas is introduced into the chamber and the temperature is increased by applying current on the tungsten filament. In a preferred embodiment, 100 Watts DC plasma is applied for about 10 to about 20 seconds first to etch the Ni microparticles, then 40 sccm acetylene ($C_2H_2$) gas is introduced and the plasma intensity is increased to about 170 Watts for the aligned CNT growth. The pressure during growth is about 15 Torr. The growth time is about 5 minutes, and the sample temperature during growth is below about 660° C. The CNT material comprises mostly aligned CNTs with uniform length and pre-determined site density.

Scanning electron microscopy (SEM) is employed to examine the morphology. Transmission electron microscopy (TEM) is used to characterize the structure of the CNTs by standard methods.

The CNT array materials, the catalyst substrate materials on which the CNT arrays are formed, the methods of forming the catalyst substrate material, and the methods of forming the CNT arrays utilizing the catalyst substrate material, are described in detail by reference to the following figures and diagrams.

FIG. 1 shows the different nucleation site densities of Ni microparticles having various site densities between about $7.5 \times 10^5$ cm$^{-2}$ and about $3 \times 10^8$ cm$^{-2}$. The white dots shown in the pictures are the Ni microparticles that are confirmed by Energy Dispersive X-ray Spectroscopy (EDX). The figure shows that most of the Ni microparticles have a diameter between about 100 nm and about 200 nm with some microparticles having a diameter smaller than about 50 nm. The figure also shows that the Ni microparticles produced by the methods of the invention are randomly located on the surface of the catalyst substrate material.

FIG. 2 shows CNT arrays having various site densities. The CNT arrays shown in FIG. 2 are formed by PECVD methods utilizing the catalyst substrate materials shown in FIG. 1. It is shown that the pre-determined site density of the CNT tubules is controlled by the pre-determined site density of the transition metal microparticles of the catalyst substrate. FIGS. 2(a) to (e) shows the different site densities of CNTs grown from the electrodeposited Ni microparticles. The CNT site densities of the samples are about $7.5 \times 10^5$ cm$^{-2}$ (FIG. 2(a)), $2.0 \times 10^6$ cm$^{-2}$ (FIG. 2(b)), $6.0 \times 10^6$ cm$^{-2}$ (FIG. 2(c)), $2.0 \times 10^7$ cm$^{-2}$ (FIG. 2(d)), and $3 \times 10^8$ cm$^{-2}$ (FIG. 2(e)). FIG. 2(f) provides a expanded view of an individual CNT.

Figure 3A:
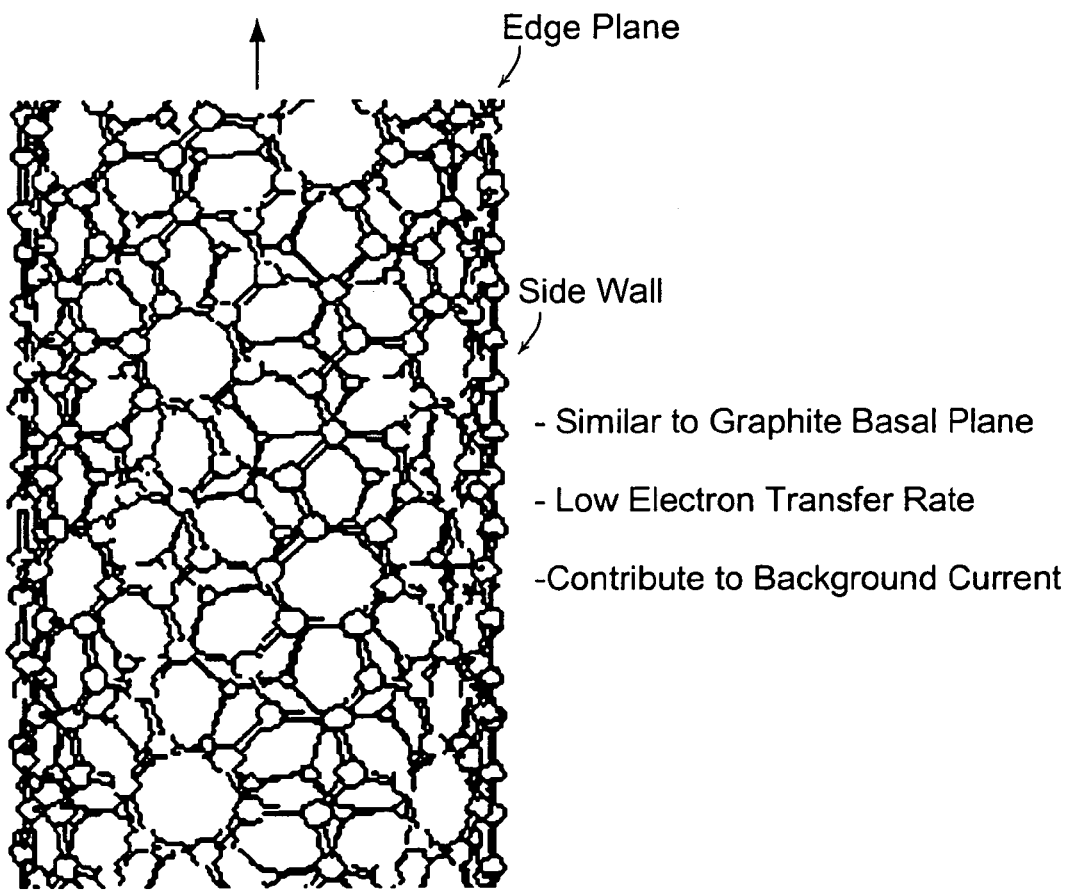
FIG. 3(a) is a pictorial view of an open-end multi-walled CNT.
Figure 3B:
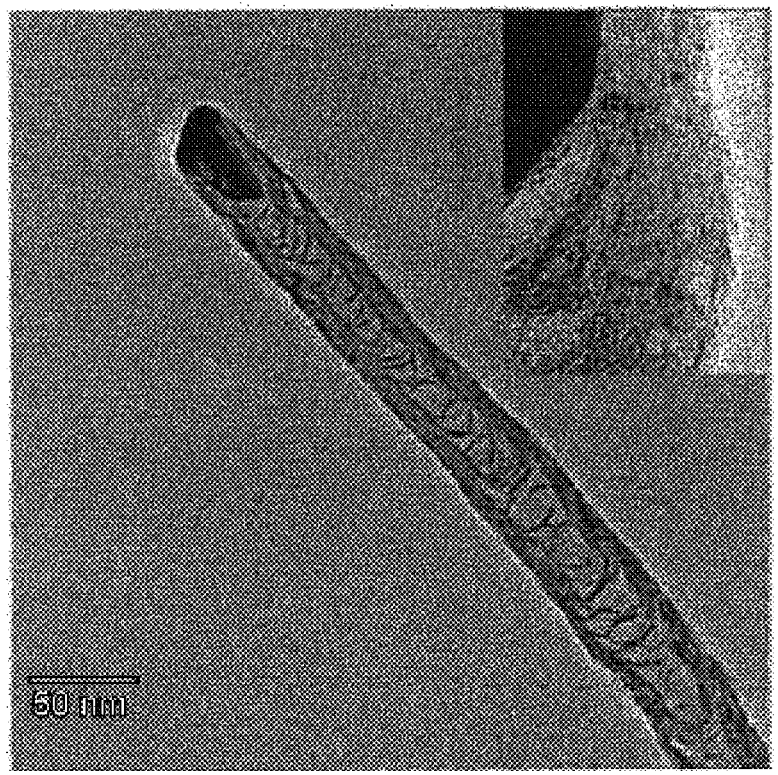
FIG. 3(b) is a TEM micrograph of a single aligned CNT tubule with a bamboo morphology, and its similarity to the CNT tubules grown on Nickel (Ni) thin films.

FIG. 3 shows a typical CNT of the present invention. FIG. 3(a) shows a pictorial view of an open-end multi-walled CNT of the present invention. FIG. 3(b) shows a TEM micrograph of a CNT grown by the methods of the invention. The image shows that the CNTs have a bamboo-like structure, which is similar with that of the CNTs grown from Ni thin films prepared by sputtering using similar PECVD methods. FIG. 3 shows that the microstructure does not depend on the way the Ni catalyst is prepared.

Figure 4:
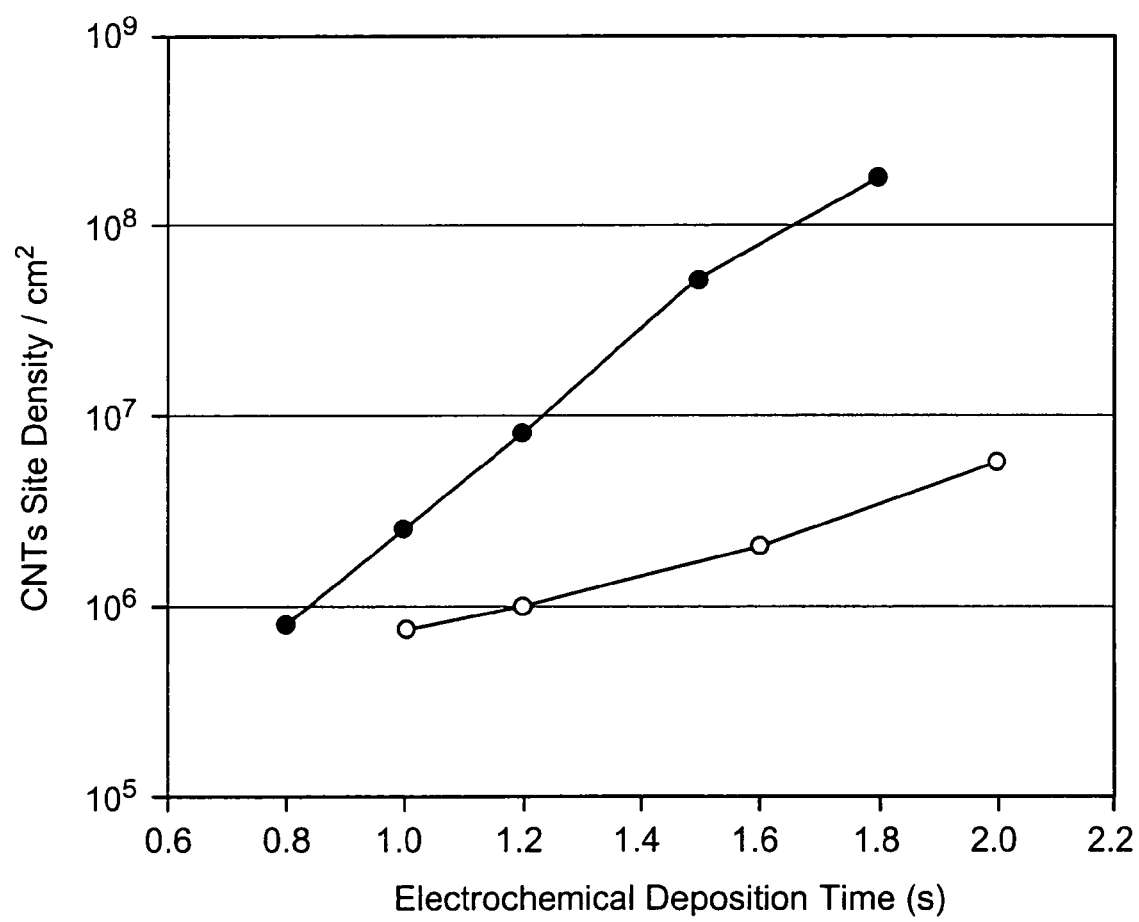
FIG. 4 shows CNT site density dependence of electrochemical deposition current density on deposition time at current density of 1.0 mA/cm$^2$. Filled circles represent a deposition current fixed at 2.0 mA/cm$^2$. Open circles represent a deposition current fixed at 1.0 mA/cm$^2$.
Figure 5A:
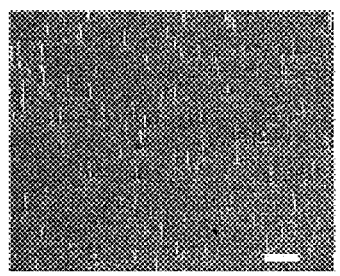
FIG. 5(a) shows sample D.
Figure 5B:
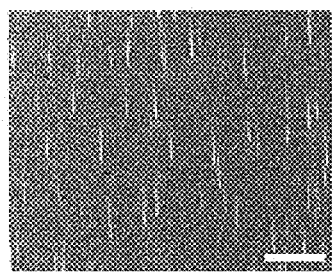
FIG. 5(b) shows sample F.
Figure 5C:
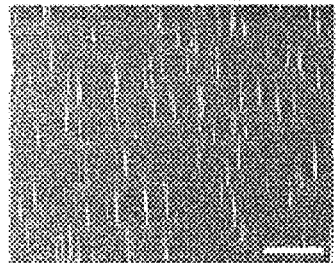
FIG. 5(c) shows sample G.
Figure 5D:
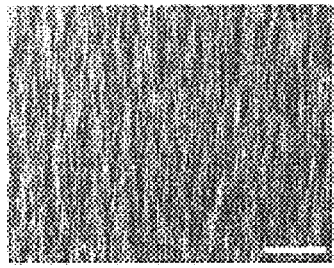
FIG. 5(d) shows sample H. The images show that the CNT films have different site densities and lengths. The white scale bar is corresponds to 10 μm.

FIG. 4 shows that by adjusting the current density and the deposition time, aligned CNTs with site density from about $1 \times 10^5$ to about $1 \times 10^8$ cm$^{-2}$ are achieved. FIG. 4 shows that CNT site density is dependent on electrochemical deposition current density and deposition time. For example, at a current density of about 1.0 mA/cm$^2$, the CNTs site density increases to about 8 times when the deposition time increases from about 1.0 to about 2.0 seconds, whereas at a deposition time of about 2.0 mA/cm$^2$, the CNTs site density increased greater than about 100 times when the deposition time increases from about 0.8 to about 1.8 seconds.

Another aspect of the present invention relates to fabrication of films comprising vertically aligned CNT electrodes with variable field emission characteristics, whereby the field emission properties of the films are controlled by independently varying the length of CNTs in the aligned array within the film or by independently varying inter-tubule spacing of the CNTs within the array (site density). Vertically aligned CNT electrodes comprise the CNT materials of the present invention comprising an array of substantially linear carbon nanotubes with controllable site densities, wherein the individual tubules within the arrays are attached to a catalyst substrate material, in a manner as to be aligned with respect to one another within the array. The inter-tubule spacing of the CNTs within the array are varied by controlling the site density of the catalytic transition metal microparticles upon which the CNTs are grown.

The intrinsic field enhancement factor $\gamma_0$ of an individual carbon nanotube in planar diode configuration, which is defined as the ratio of the local electric field at the tip of carbon nanotube to the macroscopic electric field, is approximated by Equation (1).

$$\gamma_0 = 1.2(l/r + 2.15)^{0.9} \tag{1}$$

wherein l and r are the length and the radius of carbon nanotube, respectively. Equation (1) represents $\gamma_0$ calculated using the computer program CIELAS2™ Granta Electronics, Cambridge, U.K.), which simulates the electrostatic field distribution based on the finite zelement method for the cylindrical tube with hemispherical end in the range of $4 \leq l/r < 3000$ with the accuracy of ±3%.

Taking into consideration the effect of spacing between carbon nanotubes, the field enhancement factor $\gamma$ of carbon nanotube film can be approximated by Equation (2)

$$\gamma = \gamma_0 (1 - \exp(-2.3172 s/l)) \tag{2}$$

wherein s is the spacing between carbon nanotubes. Equation (2) represents $\gamma$ calculated using the computer program MACSIMION Version 2.04 that simulates the electrostatic field distribution for the uniformly spaced square array of cylindrical tubes with hemispherical end.

This field enhancement factor is experimentally determined from the slope of Fowler-Nordheim plot if the work function is known, and is used to compare the field emission characteristics of carbon nanotubes with different length and spacing. However, the field enhancement factor extracted from the Fowler-Nordheim plot is affected by the adsorbates and/or by the geometry of configuration, so that the comparison based on the field enhancement factor determined from the Fowler-Nordheim plot can result in error.

Therefore, another parameter, local electric field, $E_{local}$, is used in to compare the field emission from carbon nanotubes with different length and spacing. $E_{local}$ is defined as the electric field at the tip of carbon nanotubes when the emission current density reaches a certain value. It is known that $E_{local}$ is nearly constant over samples fabricated by the same method and is related to the macroscopic electric field $E_{mac}$ by the field enhancement factor. As a result, a comparison of $E_{mac}$'s at certain current density for carbon nanotube films with different length and spacing, indirectly compares the field enhancement factors of those carbon nanotubes films. The current density is chosen to be 1 mA/cm$^2$ because it is the minimum current density required to obtain the brightness of 300 cd/m$^2$ from a VGA display with a typical high voltage phosphor screen efficiency of 9 lm/W. The macroscopic electric field and the local electric field to obtain the current density of 1 mA/cm$^2$ are denoted by $E_{mac,1}$ and $E_{local,1}$, respectively. As $E_{local,1}$ is proportional to $E_{mac,1}$ and the proportionality constant is given by Equation (1) and Equation (2), $E_{mac,1}$ is related to the length and spacing of carbon nanotubes by Equation (3).

$$E_{mac,1} = E_{local,1} / [1.2(l/r + 2.15)^{0.9}(1 - \exp(-2.3172 s/l))] \tag{3}$$

Since $E_{local,1}$ can be regarded as a constant, $E_{mac,1}$ given by Equation (3) is used to compare the field emission from carbon nanotube films with varying length and spacing.

Figure 6:
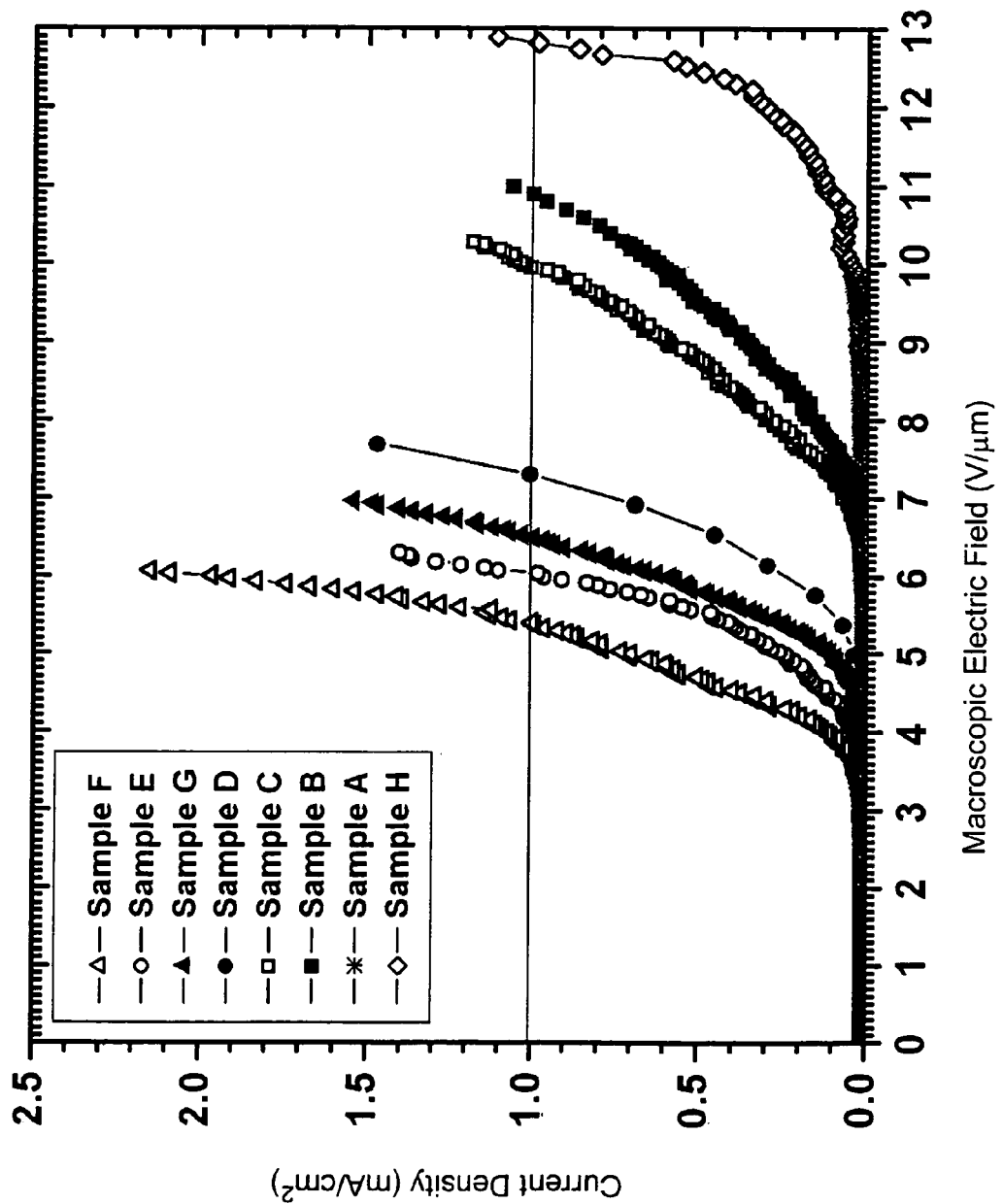
FIG. 6 shows a plot of measured current densities as a function of the macroscopic electric field for samples A-H. Sample A is represented by -*-. Sample B is represented by -■-. Sample C is represented by -□-. Sample D is represented by -●-. Sample E is represented by -○-. Sample F is represented by -Δ-. Sample G is represented by -▲-. Sample H is represented by -◇-. The horizontal axis represents Macroscopic Field (V/μm). The vertical axis represents current density (mA/cm$^2$).

Firstly, $E_{mac,1}$'s for samples of varied site density CNT arrays (shown as A-G) are plotted in FIG. 6 in order to investigate the effect of the length of carbon nanotubes on emission properties. $E_{mac,1}$ for sample H is not included in this plot because the carbon nanotube density of sample H is much higher than the other samples. The measured data show that the same current density is obtained at lower macroscopic electric field as the length of carbon nanotubes is increased.

Figure 7:
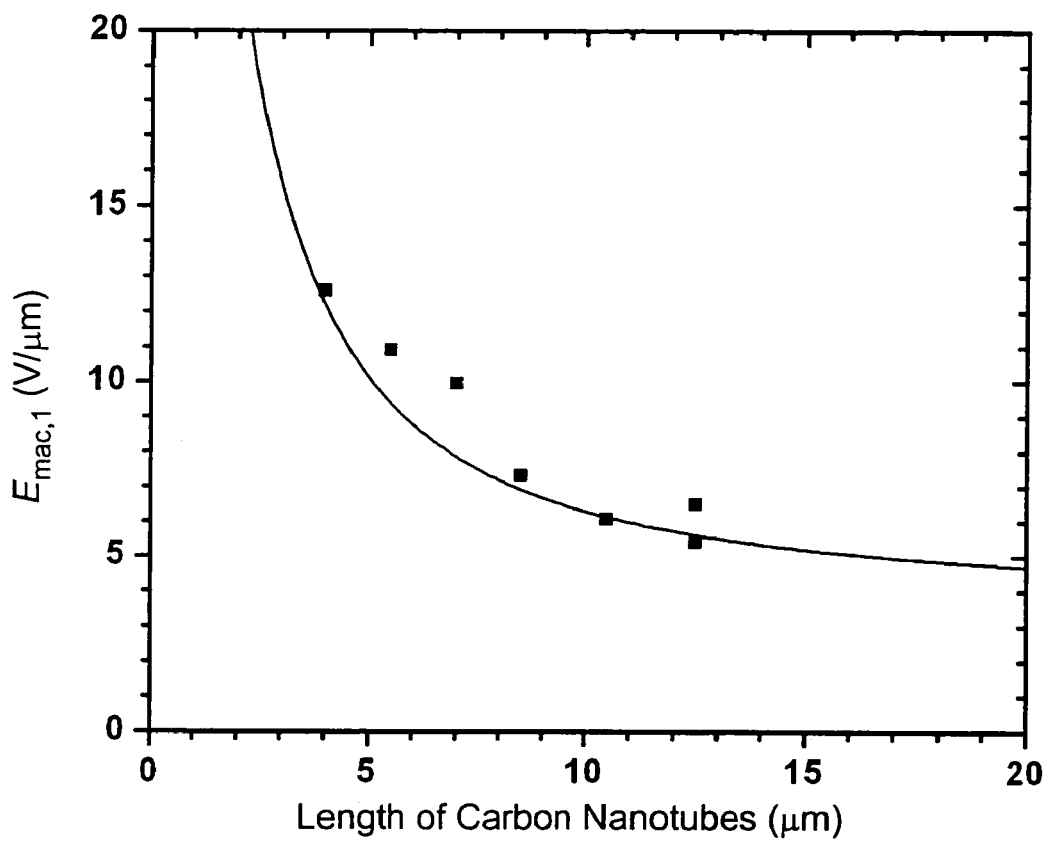
FIG. 7 shows the change in macroscopic electric fields $E_{mac,1}$ at the average current density of 1 mA/cm$^2$ as a function of the length of carbon nanotubes. The horizontal axis represents length of CNTs (μm). The vertical axis represents $E_{mac,1}$ (V/μm).

In FIG. 7, the dotted curve represents Equation (3) wherein r=8 nm, s=8 μm, and $E_{local,1}$=3.9 V/nm. The agreement of the experimental data with Equation (3) is satisfactory, even considering that the samples have non-uniformity regarding length, spacing, and radius. Due to this non-uniformity of the size of the nanotubes in the carbon nanotube film, only some preferred nanotubes with longer length and smaller radius can take part in the field emission. The spacing, s=8 μm, used in the calculation of the dotted curve in FIG. 7 is within the range of spacing between nanotubes of 4-10 μm calculated from the density of carbon nanotubes shown in Table 1. In addition, $E_{local,1}$=3.9 V/nm at the average current density of 1 mA/cm$^2$ is quite similar to $E_{local,1}$=4.1 V/nm calculated from known data.

Figure 8:
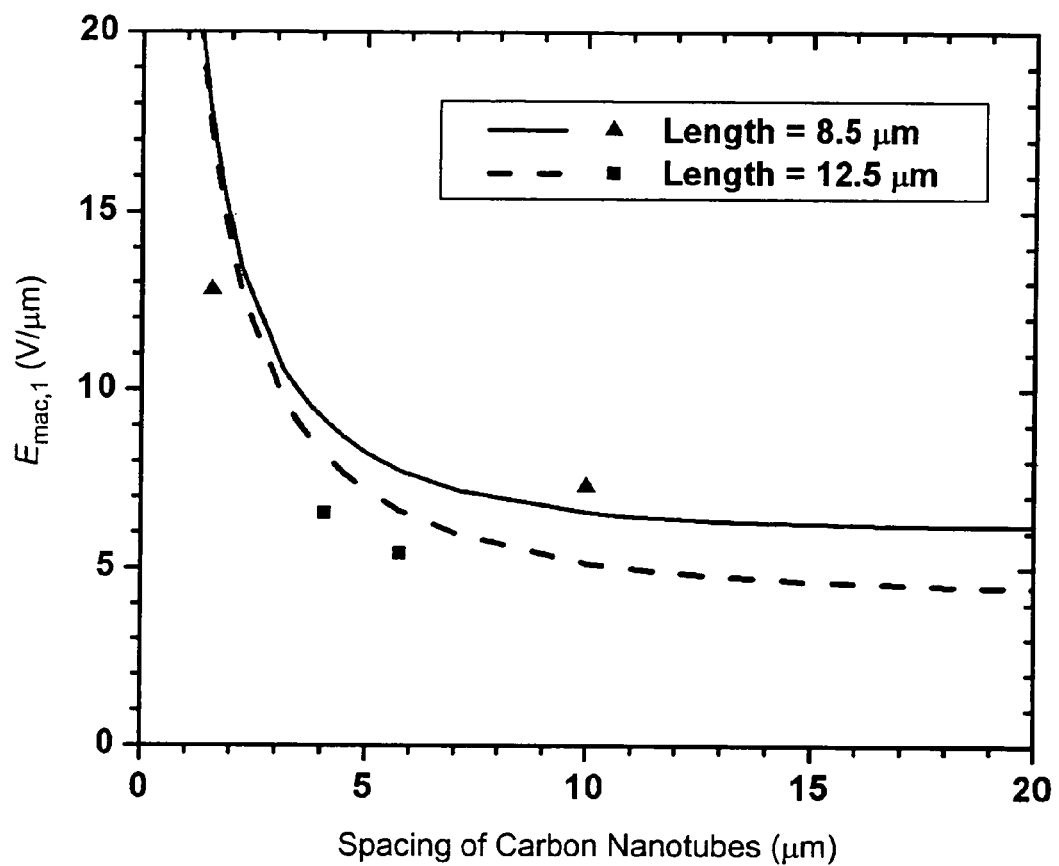
FIG. 8 shows the change in macroscopic electric fields $E_{mac,1}$ at the average current density of 1 mA/cm$^2$ as a function of the spacing of carbon nanotubes. Triangles, -▲-, represent samples D and H, and squares, -●-, represent samples F and G. The horizontal axis represents spacing of CNTs (μm). The vertical axis represents $E_{mac,1}$ (V/μm).

Secondly, $E_{mac,1}$'s for sample D, F-H are plotted in FIG. 8 in order to investigate the effect of the spacing of carbon nanotubes on emission properties. In FIG. 8, the solid and the dotted curves represent Equation (3) with l=8.5 μm and 12.5 μm, respectively. Other parameters are r=8 nm and $E_{local,1}$=3.9 V/nm. The measured data are also in agreement with Equation (3) and show that the same current density are obtained at lower macroscopic electric field as the spacing of carbon nanotubes is increased.

One embodiment of the present invention provides studies of shielding effects between individual tubules for field emission and microelectrodes. In a particular embodiment, the field emission characteristics of vertically aligned CNT films are compared following the independent variation of the length and the spacing of the CNTs. The macroscopic electric field $E_{mac,1}$ at the current density of 1 mA/cm$^2$ is used as a criterion for comparison. For a given length of carbon nanotubes, $E_{mac,1}$ is decreased as the spacing of carbon nanotubes are increased, and for a given spacing of carbon nanotubes, $E_{mac,1}$ is decreased as the length of carbon nanotubes are increased except for the very high density carbon nanotube film. It is estimated that $E_{mac,1}$ is nearly saturated to be about 3 V/μm when the site density is lower than about 10$^6$ cm$^{-2}$ and the length is longer than about 10 μm.

In another particular embodiment, multiwall carbon nanotubes are obtained and the diameter of the nanotubes are in the range of 50-80 nm. In one embodiment, 8 samples, Samples A-H, are prepared. FIG. 5 shows four of the SEM micrographs of these samples. The estimated length and site density, from the SEM images, are listed Table 1. The site density of sample H is much higher than any other samples as shown in FIG. 10.

TABLE 1

Length characteristics of carbon nanotube films with varying site densities.

| Sample | Length | Density |
|---|---|---|
| A | 4.0 μm | 6 × 10$^6$/cm$^2$ |
| B | 5.5 μm | 5 × 10$^6$/cm$^2$ |
| C | 7.0 μm | 2 × 10$^6$/cm$^2$ |
| D | 8.5 μm | 1 × 10$^6$/cm$^2$ |
| E | 10.5 μm | 1 × 10$^6$/cm$^2$ |
| F | 12.5 μm | 3 × 10$^6$/cm$^2$ |
| G | 12.5 μm | 6 × 10$^6$/cm$^2$ |
| H | 8.5 μm | 4 × 10$^7$/cm$^2$ |

The field emission current of samples A-H are measured by the simple diode configuration. The anode is a molybdenum disk with a diameter of 5 mm and the gap between the silicon substrate and the anode is 300 μm. The emission characteristics are of the whole 5 mm diameter area. It should be very close to the value scaled to 1 cm$^2$, not like the reports that were scaled up from a tip of less than 0.1 mm diameter. Local properties, i.e. properties of a microscopic area cannot be expressed as a function of the same properties over a larger area (macroscopic area) based on calculations. The measured current densities as a function of the macroscopic electric field are shown in FIG. 6. The dotted line corresponds to the current density of 1 mA/cm$^2$ and the values of electric field required to obtain this current density are 10.9, 9.95, 7.30, 6.05, 6.50, 5.40, 12.8 V/μm for samples B through H, respectively. The emission current of sample A does not reach 1 mA/cm$^2$ because of short length and high density.

Figure 9:
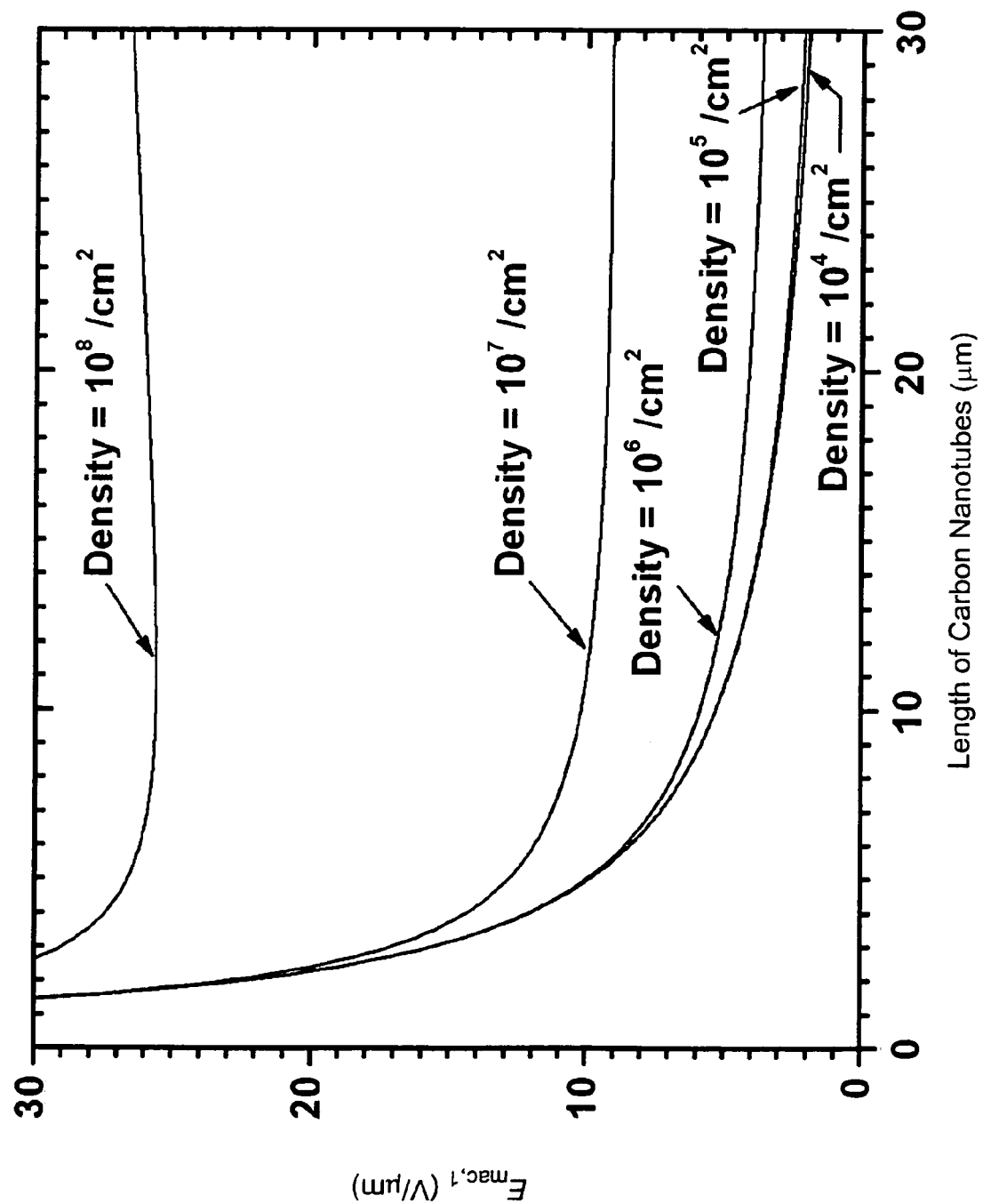
FIG. 9 shows the change in macroscopic electric fields $E_{mac,1}$ at the average current density of 1 mA/cm$^2$ as a function of the length and the density of carbon nanotubes. The horizontal axis represents length of CNTs (μm). The vertical axis represents $E_{mac,1}$ (V/μm).
Figure 10A:
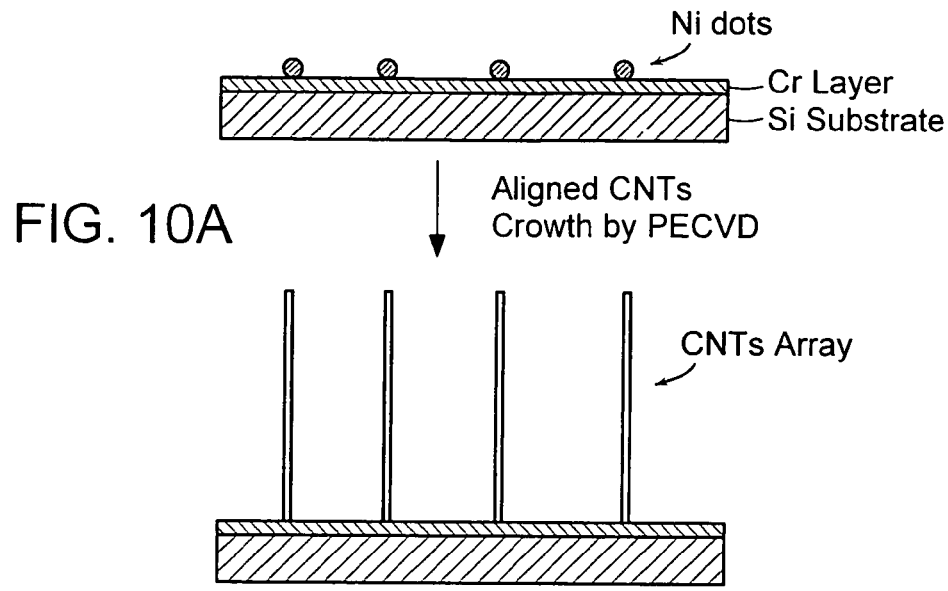
FIG. 10(a) shows a catalytic substrate comprising Ni microparticles deposited on a chromium coated silicon substrate.
Figure 10B:
FIG. 10(b) shows an array of aligned carbon nanotube grown on the catalytic substrate.
Figure 10C:
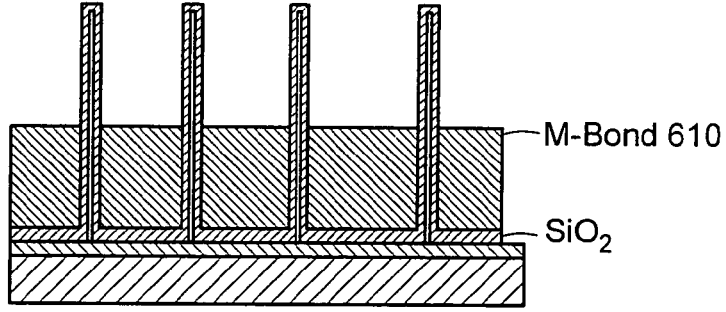
FIG. 10(c) shows a coating of SiO$_2$ and a two-component, solvent-thinned, epoxy-phenolic adhesive (M-Bond 610™)
Figure 10D:
FIG. 10(d) shows exposure of the CNTs after a terminal polishing step.
Figure 10D:
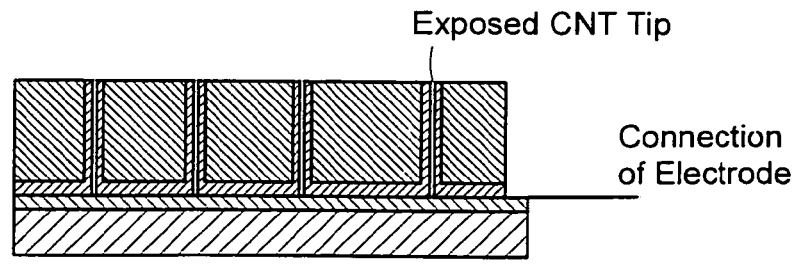
Figure 10E:
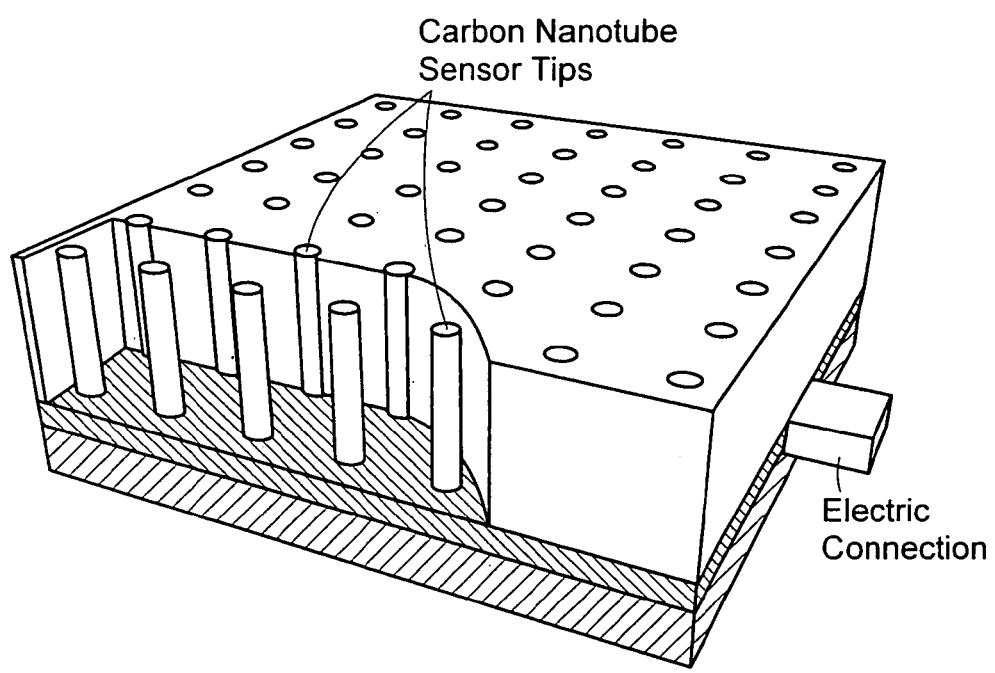
FIG. 10(e) shows a perspective view of the CNT nanoelectrode.
Figure 11A:
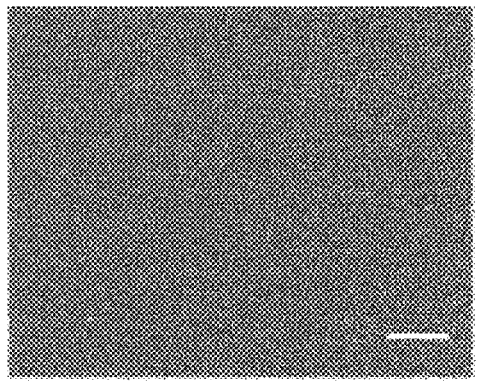
FIG. 11(a) is a top view.
Figure 11B:
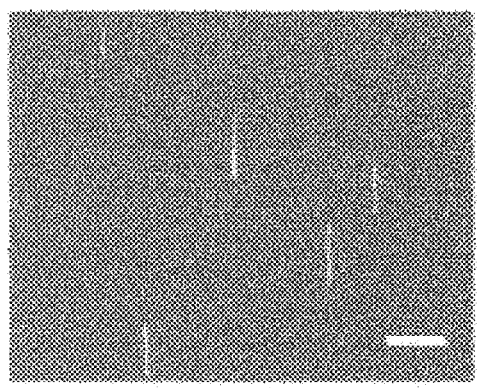
FIGS. 11(b) to 11(f) are side views from a 45° angle. The scale bars represent 5 μm.
Figure 11C:
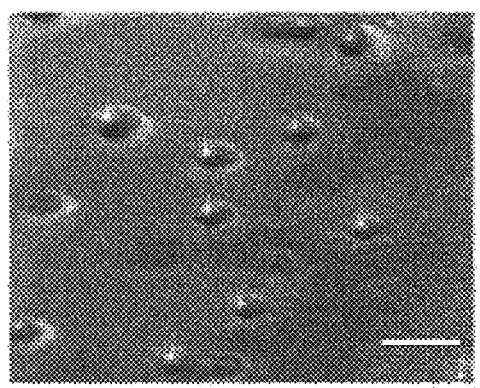
Figure 11D:
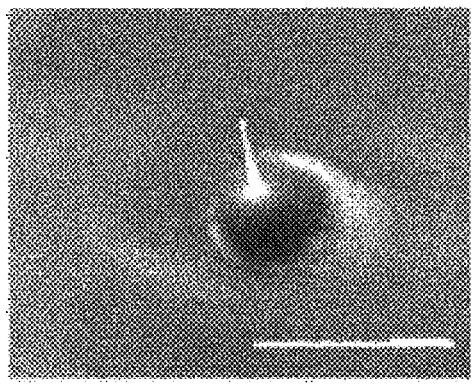
Figure 11E:
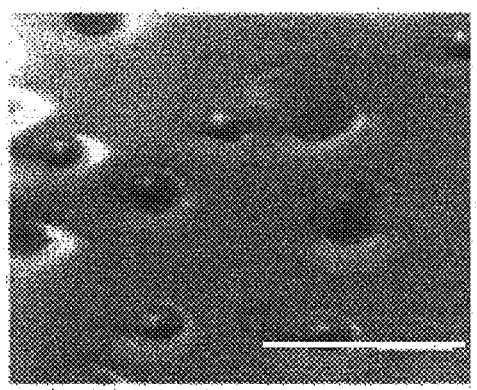
Figure 11F:
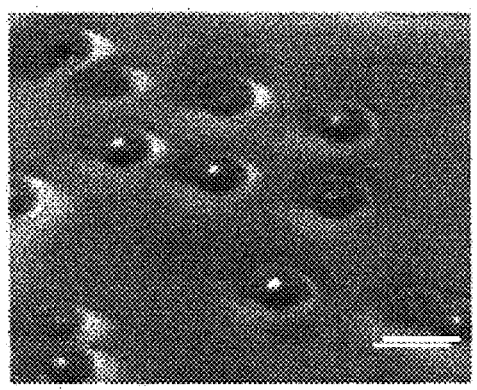

In FIG. 9, $E_{mac,1}$ is calculated for a wider range of length and spacing using r=8 nm and $E_{local,1}$=3.9 V/nm. From this figure, it can be seen that the increase of spacing does not effectively reduce $E_{mac,1}$ for the short carbon nanotube film. It can also be seen that $E_{mac,1}$ is nearly saturated to be about 3 V/μm when the density is lower than 10$^6$ cm$^{-2}$ and the length is longer than 10 μm. This means that the increase of the length and spacing effectively reduces $E_{mac,1}$ up to a certain level. In order to decrease $E_{mac,1}$ further, it is required to reduce the diameter of the vertically aligned carbon nanotubes. FIG. 9 shows that $E_{mac,1}$ is increased as the length of carbon nanotubes are increased if the density is very high, for example, 10$^8$ cm$^{-2}$ or higher. This behavior at very high density is qualitatively in agreement with known results.

Another aspect of the invention relates to microelectrode arrays (MEAs) comprising site density controlled CNT array materials. In particular the present invention relates to nanoelectrode arrays (NEAs) comprising an array of substantially linear CNTs with controllable site densities wherein the arrays are attached to a catalyst substrate material, wherein the carbon nanotubes are aligned with respect to one another within the array. Compared with traditional macroelectrodes, the CNT-NEAs of the present invention have high mass sensitivity, an increased mass-transport rate, a decreased influence of the solution resistance, and a higher signal-to-noise ratio, leading to much lower background current. Those skilled in the art will recognize that other carbon nanostructures known in the art, for example carbon nanofibers, would be within the spirit and scope of the present invention and could be used to fabricate the nanoelectrode arrays (NEAs) of the present invention.

In one embodiment, the NEAs comprise a) an array of substantially linear CNTs and b) an insulator coating (i.e., electrically insulating layer) on the surface of the array, wherein the distal ends (tips) of CNT tubules are exposed and thus extend beyond the insulating coating. In another embodiment, the NEAs optionally further comprise c) an adhesive coating (i.e., second adhesive electrically insulating layer) on the surface of the insulator coating, wherein the distal ends (tips) of CNT tubules are exposed and thus extend beyond the adhesive coating. In a preferred embodiment, the insulator or adhesive coating has a polished surface. The NEAs optionally further comprise c) a metal wire attached to the catalyst substrate, preferably at the corner of the catalyst substrate. The NEAs provided by the invention can comprise up to millions of nanoelectrodes from the controlled site density CNT array of the invention. In a preferred embodiment each electrode of the NEA has a diameter of about 100 nm.

Another aspect of the invention relates to methods of producing NEAs comprising site density controlled CNT array materials. In one embodiment, the NEAs are produced by coating the CNT material with an insulator layer. In another embodiment, the NEAs are produced by additionally coating the insulator layer coated CNT material with an adhesive such as the epoxy-phenolic adhesive M-Bond 610™ or Epon 828™. The distal ends (tips) of the CNTs extend beyond the insulator layer and/or adhesive layer. Optionally, after the insulator layer and/or adhesive layer is applied, the surface of the insulator and/or adhesive coated CNT material is polished. Polishing the coated CNT array materials is utilized to expose the distal ends (tips) of the CNTs if needed. Optionally, an insulated metal wire is attached to the corner of the catalytic substrate of the NEAs. The surface of insulator and/or adhesive coated CNT material can be polished using any suitable means known in the art. In one embodiment a fiber free cloth is used to polish the surface of insulator and/or adhesive coated CNT material.

In one embodiment, the NEAs are produced by coating the CNT material with a $SiO_2$ coating and then coating the $SiO_2$ coated CNT material with an epoxy-phenolic adhesive such as M-Bond 610™. In another embodiment, the NEAs are produced by coating the CNT material with a $SiO_2$ coating and then coating the $SiO_2$ coated CNT material with an epoxy-phenolic adhesive such as Epon 828™. The NEAs provided by the invention can comprise up to millions of nanoelectrodes from the controlled site density CNT array of the invention. In a preferred embodiment each electrode of the NEA has a diameter of about 100 nm. Cyclic voltammetry and square wave voltammetry are used to characterize the carbon NEAs.

NEAs, their production and their physical properties are described in detail by reference to the following figures and diagrams.

FIG. 10 is a schematic representing one embodiment of the fabrication procedure for a site density controlled CNT nanoelectrode array of the present invention. After electrochemical deposition of Ni microparticles (shown in FIG. 10(a)), an aligned CNTs array is grown (shown in 10(b)), and then a thin layer of $SiO_2$ is coated on the surface by magnetron sputtering to insulate the chromium layer. After applying the $SiO_2$ coating, an epoxy-phenolic adhesive such as M-Bond 610™ (Two-component, solvent-thinned, epoxy-phenolic adhesive from Vishay Intertechnology, Inc.), about 5 µm thick, is coated and cured at about 170° C. for about 2 hours, which further insulates the chromium and also provides the mechanical support to the CNTs. After the coating steps, the CNTs are half embedded in the polymer resin as shown in FIG. 10(c), thus the distal ends of the CNTs extend beyond both layers. In the next step, a fiber free cloth is used to polish the surface that mechanically breaks the top part of CNTs and exposes the tip of CNTs as shown in FIG. 10(d). The sample surface is then rinsed in deionized water and an insulated copper wire (0.5 mm in radius) is attached to the corner of the substrate by applying a drop of conductive silver epoxy followed by insulating epoxy. The copper wire-NEAs assembly is left to cure in air at room temperature for several hours. FIG. 10(e) is a perspective view of the CNT-NEA of the present invention.

FIG. 11 shows the SEM images of the NEAs fabrication steps corresponding to the scheme shown in FIG. 10. The bright dots in FIG. 11(a) are the electrodeposited Ni microparticles that are randomly distributed on the substrate. This sample has site density of about $10^6$ $cm^{-2}$ and average interspacing of about 10 µm. FIG. 11(b) shows the low site density aligned CNTs array grown by PECVD method from the Ni microparticles. FIG. 11 (c) shows the morphology after coating of a thin layer of $SiO_2$ followed by a second layer of epoxy film. The CNTs array are half embedded in the polymer. FIG. 11(d) provides a close-up look at a single half embedded CNT. FIG. 11(e) shows the topography after polishing. It is clearly shown that only the tip of the embedded CNTs is exposed. In order to prove that the tip of the CNTs is exposed and conducting, electrodeposition of the Ni microparticles is repeated on the sample. FIG. 11(f) shows that the Ni microparticles are only deposited on the CNTs tips. This also indicates that the carbon NEAs array could be used as template to fabricate other metal NEAs.

Figure 12:
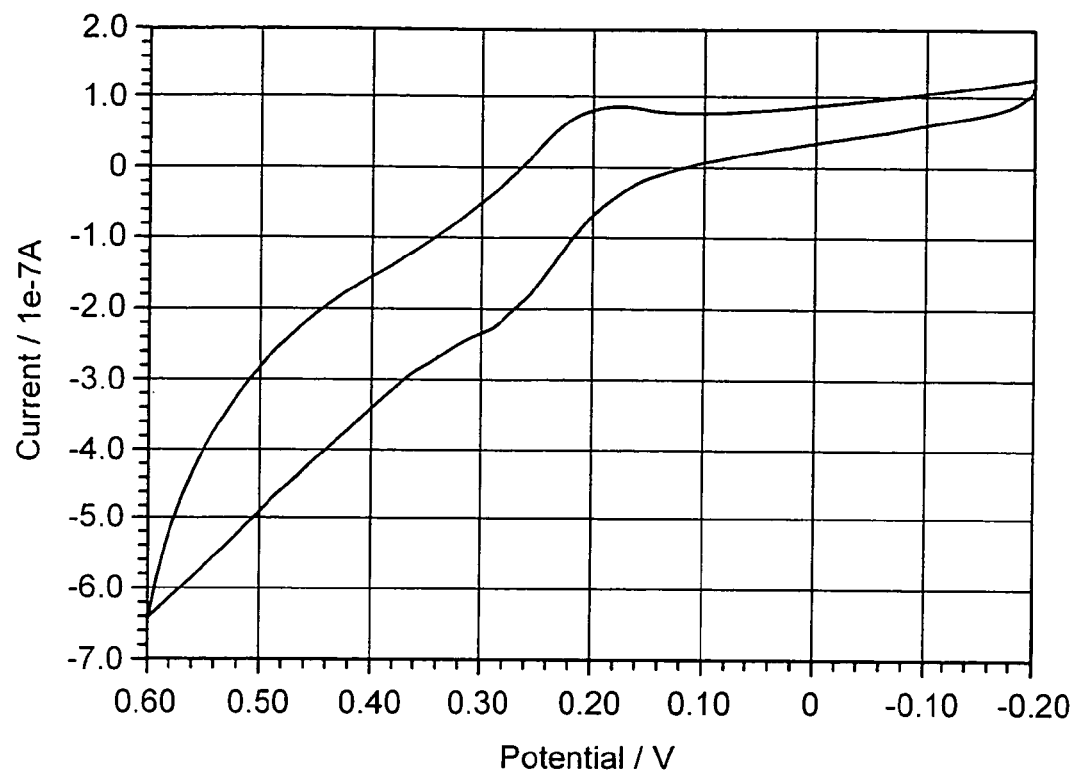
FIG. 12 shows a cyclic voltammetry curve of a controlled density aligned CNT nanoelectrode array. The curve is taken in solution of 4 mM K$_3$Fe(CN)$_6$ in 0.5 M KNO$_3$. The scan rate is 40 mV/s. The horizontal axis represents length of potential (V). The vertical axis represents current (1e-7A).

FIG. 12 shows the electrochemical characterization of the NEAs. Electrochemical characterization is performed with a CHI 660 electrochemical analyzer (CH Instrument, Austin, Tex.). A one-compartment cell is used with a platinum wire as the auxiliary electrode and Ag/AgCl as the reference electrode. The cyclic voltammetry of $K_3Fe(CN)_6$ is used for the characterization of the NEAs. As shown in FIG. 12, the relative heights of the anodic and cathodic peaks in cyclic voltammogram indicated the reversibility of electrochemical reaction of $Fe(CN)_6^{4-}/Fe(CN)_6^{3-}$ redox couple on native carbon NEAs. The difference between forward and reverse scan deviated from the sigmoid shape expected from microelectrode. This may be due to the partial overlapping of the diffusion layers of individual nanoelectrode, or leakage due to the insufficient passive layer. In addition, the surface condition of the electrode and the scan rate could also affect the result. The signal (in the range of µA) generated from the NEAs of the invention is much higher compared with the signal (a few pA) generated from a couple of carbon nanoelectrodes with similar disk sharp, simply because that the total current for the loosely packed electrode array is proportional to the number of the individual electrode $i_{array}=N \cdot i_{single}$. The need for expensive electronic device for low current detection is avoided.

Figure 13:
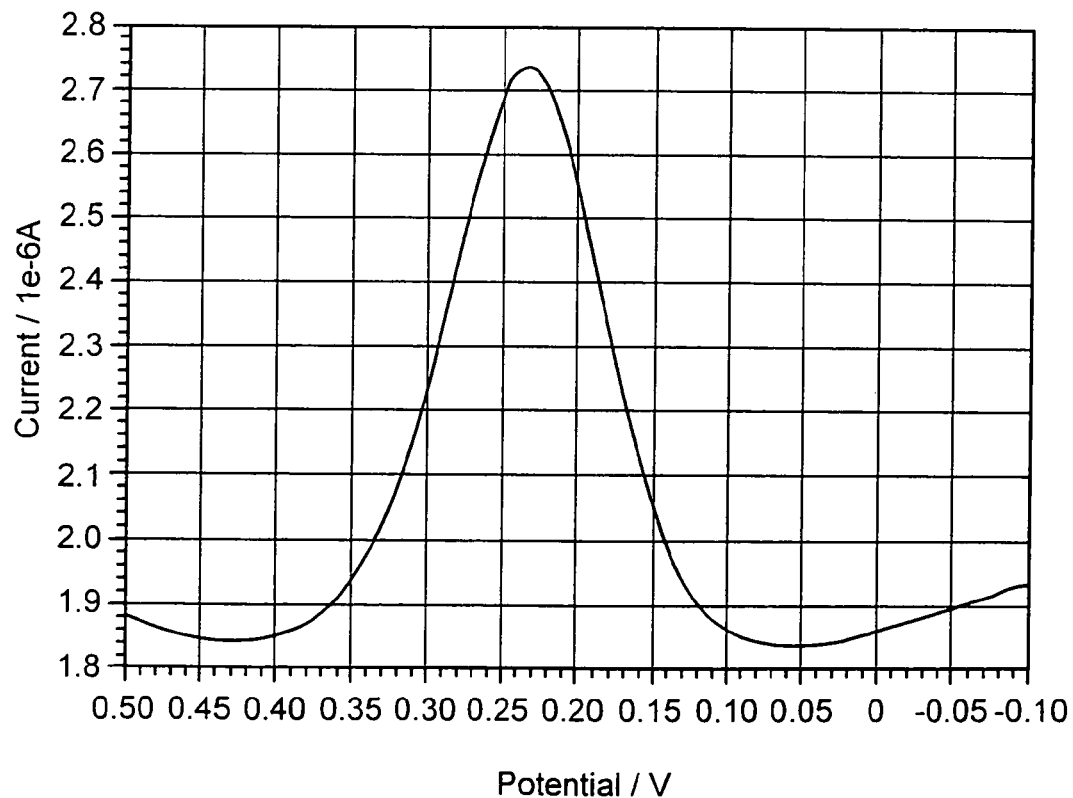
FIG. 13 shows square wave voltammetry characteristics of a controlled density aligned CNT nanoelectrode array. The curve is taken in solution of 2 mM K$_3$Fe(CN)$_6$ in 0.5 M KNO$_3$. Pulse amplitude, 25 V; step amplitude, 4 mV; frequency, 15 Hz. The horizontal axis represents length of potential (V). The vertical axis represents current (1e-6A).

FIG. 13 shows square wave voltammetry (SWV) characteristics of the NEAs. SWV is a powerful technique for electroanalysis. SWV is a large-amplitude differential technique in which a waveform composed of a symmetrical square wave, superimposed on a base staircase potential, is applied to the working electrode. The main advantages of SWV are speed and low detection limits. SWV can effectively discriminate the signal against the charging background current, enabling the very low detection limits for the analytes. To evaluate the potential applicability of the NEAs for trace analysis, SWV of $K_3Fe(CN)_6$ is studied. As shown in FIG. 13, a symmetric peak of $K_3Fe(CN)_6$ reduction is obtained. Compared with the CV curve in FIG. 12 charging background current in SWV curve is dramatically reduced.

In one aspect, the CNT-NEAs of the present invention can be used to detect aqueous-phase metal ions and drugs with high signal-to-noise ratio and low detection limits (in ppb), owing to the size reduction of each individual electrode and the increased total number of electrodes. The CNT-NEAs of the present invention can be used for electrochemical sensing of a number of metal ions, including, but not limited to, lead, arsenic, copper, cadmium, zinc, chromium, mercury, uranium, bismuth, thallium, tin, antimony, tellurium, iodine, selenium, gold, silver, cobalt, nickel, thorium and plutonium. In one preferred embodiment, CNT-NEAs of the present invention are used to detect trace concentrations of lead (II) ion.

The CNT-NEAs of the present invention can be used for electrochemical sensing of drugs, including, but not limited to, 4-acetamidophenol, neurotransmitters, and other chemicals and biomolecules including, but not limited to, carbonhydrates, insulin, cystein, hemocysteine, sulfide, phenolic compounds, choloramphenicol, myoglobin, 3,4-dihydroxyphenyacetic acid, hypoxanthine, ascorbic acid, uric acid, catechol, tryptophan, nitrite, neurotransmitters such as L-dopa, dopamine, norepinephrine, and nitric oxide. In another preferred embodiment, CNT-NEAs of the present invention are used to detect 4-acetamidophenol.

Figure 14A:
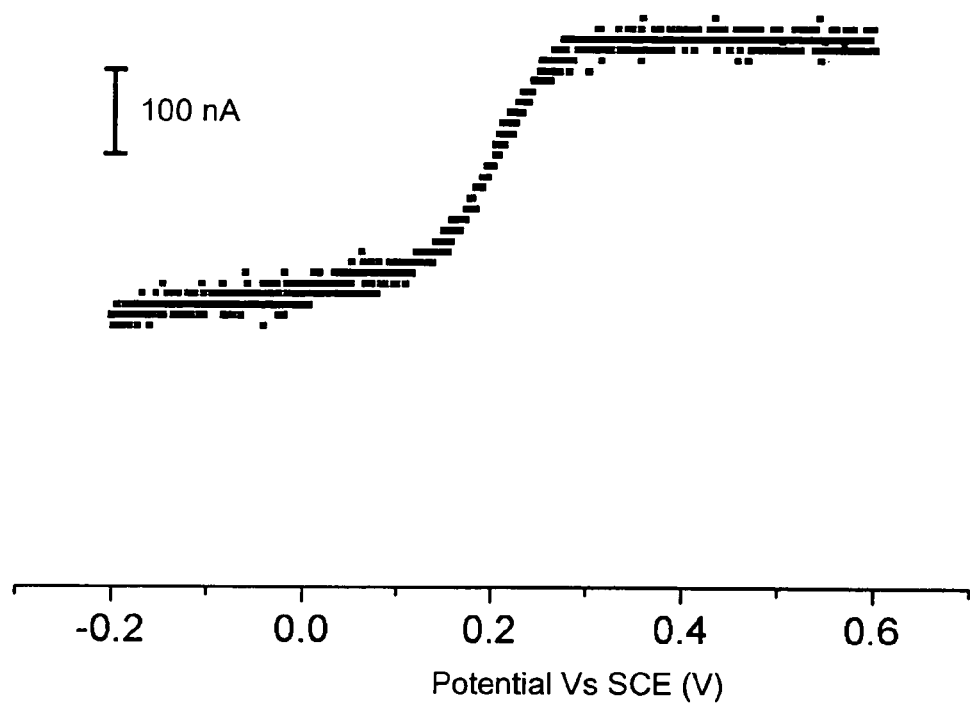
FIG. 14(a) shows the cyclic voltammogram of the CNT nanoelectrode array taken in solution of 4 mM K$_3$Fe(CN)$_6$ in 0.5 M KNO$_3$ at a scan rate of 20 mV/s.
Figure 14B:
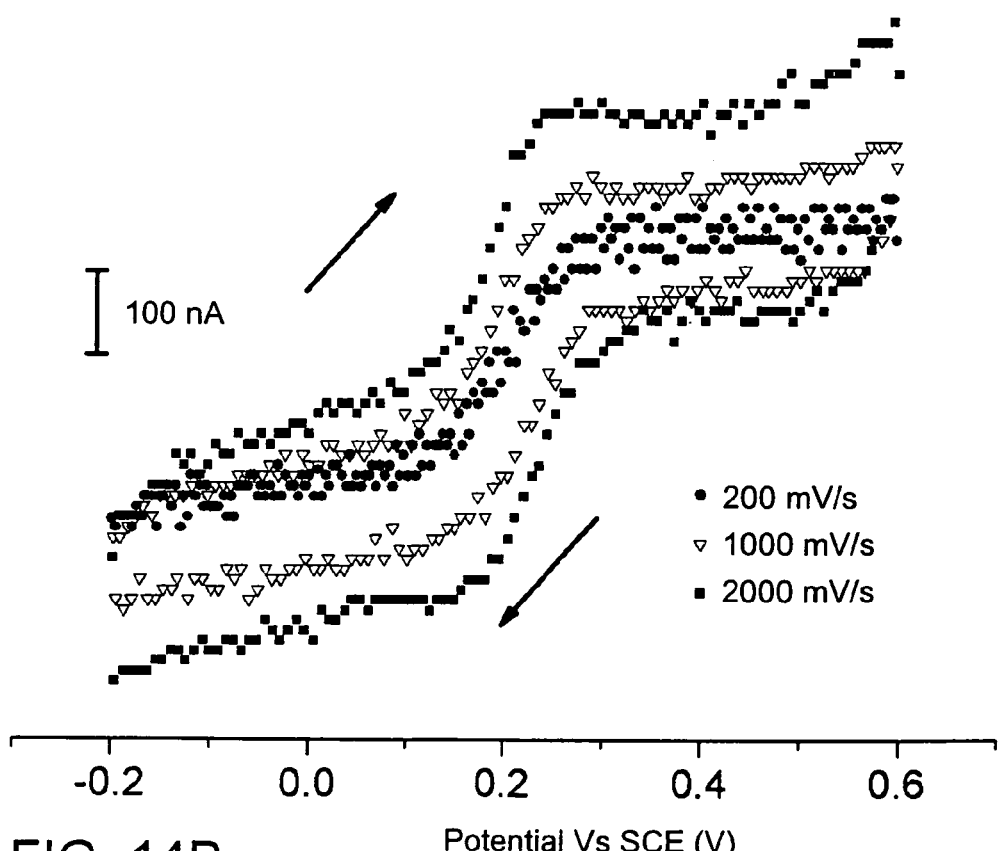
FIG. 14(b) shows the cyclic voltammogram of the CNT nanoelectrode array at a scan rate of 200-2000 mV/s. The horizontal axis represents length of potential (V). The vertical axis represents current.

FIG. 14 shows evaluation of the CNT-NEAs using cyclic voltammetry, 4 mM $K_3Fe(CN)_6$/0.5 M $KNO_3$ solution at a scan rate of 20 mV/s. Electrochemical characterization is performed with a PC4/750 Potentiostats electrochemical measurement system (Gamry Instruments, Inc.). A one-compartment cell is used with a platinum wire as the counter electrode and saturated calomel electrode (SCE) as the reference electrode. As shown in FIG. 14(a), the sigmoidal voltammogram is a sign of microelectrode behavior (radial diffusion). The steady-state current arises because the electrolysis rate is approximately equal to the rate of diffuision of analyte to the electrode surface. FIG. 14(b) shows the scan rate analysis of the NEAs. The scan-rate-independent limiting current behavior up to 500 mV/s is observed on the nanoelectrode array, which indicates that there is no diffusion layer overlap between the electrodes under this condition. This is because most of the CNTs on the NEAs are separated from their nearest neighbor for at least 5 μm, much larger than the diameter of each nanotube (50 to 80 nm). The ratio of the inter-electrode distance (d) to the electrode radius (r) is much larger than 40, which satisfies the conditions for the electrode array to produce sigmoidal shape voltammogram even at high scan rates. The peak shaped voltammograms are not observed until 2000 mV/s. This enables high-speed detections of analytes and investigations of redox processes having fast kinetics.

It is well recognized that nanoelectrodes have dramatically lower capacitive current than conventional macroelectrodes, which is also observed in the NEAs of the present invention. Capacitive current ($I_c$), the main cause of the background in voltammetry, is proportional to the active electrode area ($A_{act}$), scan rate (v), and capacitance ($C_d$); $I_c = A_{act} v C_d$. Reducing the capacitive current can greatly improve the signal to noise ratio. As shown in FIG. 14a, the forward and reverse scan curves are almost identical, which indicates very low capacitive current. The low capacitance is attributed to the very small electrode size, it is also a result of the spin coated epoxy film, in a preferred embodiment Epon 828™, due to the material itself and the layer quality. The sealing properties provided by the spin coated epoxy film leads to very low current leakage flowing to the electrode back contact, which can be seen from the flat baseline in the CV curve. At high scan rates as shown in FIG. 14b, the capacitive current increases with the increasing scan rate, causing more noticeable separation between forward and reverse scans. Lifetime of the NEAs of the present invention are significantly improved: there is no degradation for several weeks, which is attributed to the excellent stability of the epoxy layer. With proper cure, using Epon resin 828™ as the adhesive electrically insulating layer, shows excellent mechanical, adhesive, dielectric, and chemical resistant properties.

Figure 15:
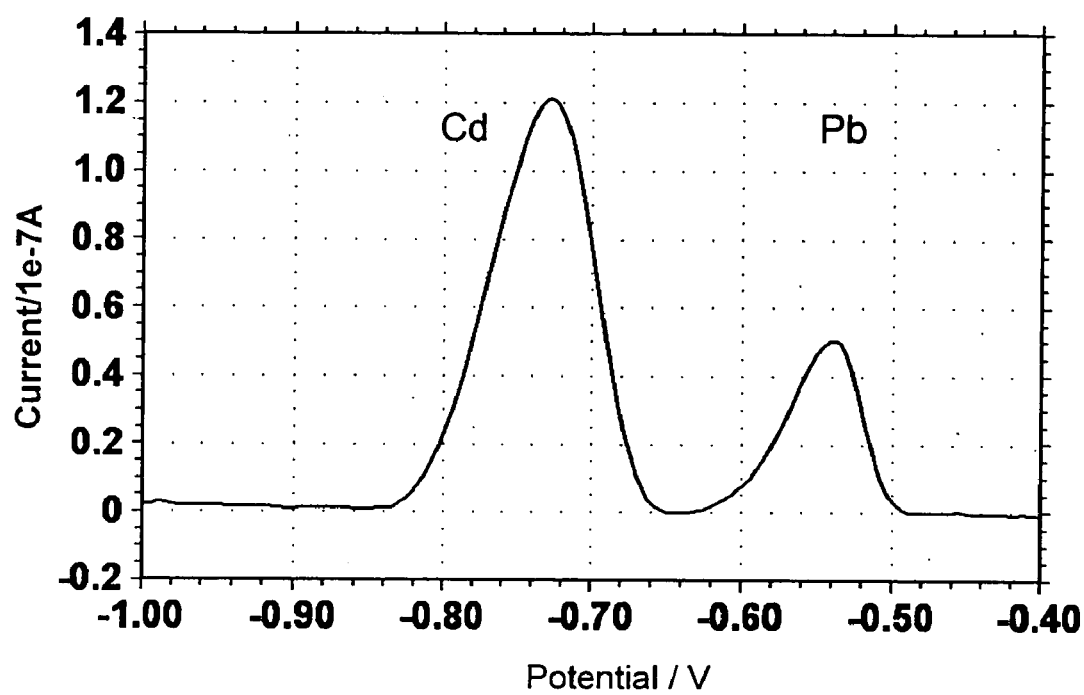
FIG. 15 shows a typical square wave voltammogram of 5 μg/L cadmium and lead on the CNT-NEA in 0.1 M acetate buffer (pH 4.5) in the presence of 500 μg/L bismuth. Other conditions include in situ plated bismuth-coated CNT-NEA with 1-min pretreatment at 0.3 V; 2-min accumulation at −1.2 V; 10-sec rest period (without stirring); square-wave voltammetric scan with a step potential of 5 mV; amplitude, 20 mV; frequency, 25 Hz.

FIG. 15 shows a voltarrmetric analysis of a low concentration of heavy metal ions on an aligned CNT-NEA of the present invention. Square wave voltammetric (SWV) measurements of target metal ions is performed using an in situ prepared bismuth film on a CNT-NEA during a 30-sec pretreatment at 0.3 V followed by 2-min accumulation at -1.2 V in 10-mL 0.1 M acetate buffer (pH 4.5). Subsequent stripping is performed after a 10-sec rest period (without stirring) from -1.0 V to -0.4 V with a step potential of 5 mV, amplitude 20 mV, and frequency of 25 Hz. FIG. 15 presents the square voltammogram for a mixture containing 5 μg/L cadmium and lead ions in the presence of 500 μg/L bismuth in connection to a 2-min deposition. A well defined, undistorted, sharp signal with a favorable resolution is obtained. The peak potentials of cadmium and lead are -0.75 V and -0.55 V, respectively. The stripping signal for the selected target metal is surrounded with low background contributions, indicating effective sealing on the side-wall of CNT in the preparation of the CNT-NEAs. A comparison experiment with a CNT film electrode and a glassy carbon working electrode under the same conditions resulted in a poor striping signal. These results indicate that the aligned nanotube array electrode (CNT-NEA) have the advantage of being able to detect lower concentrations of metal ions, which is attributed to the higher signal-to-noise ratio. The low Bi(III) concentration in situ plating in the measuring solution avoids the use of mercury, which is used for traditional trace metal voltammetric analysis. The very attractive signal-to-noise characteristics and peak resolution indicate that the aligned CNT-NEA can be used as an excellent electrochemical sensing platform.

Figure 16A:
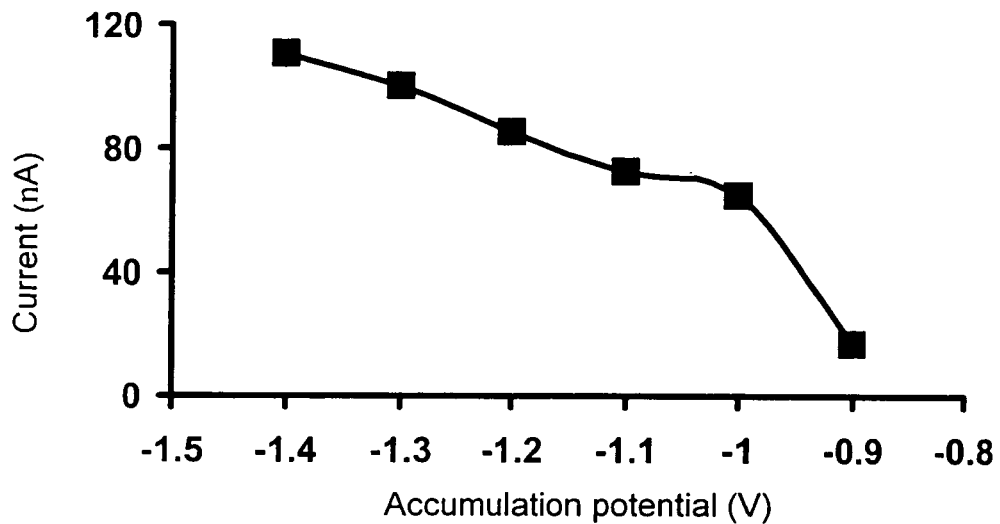
FIG. 16 shows the effect of accumulation potential (A) and accumulation time (B) on cadmium SWV response. Cadmium concentration: 5 μg/L; accumulation Time (A): 1 min; accumulation potential (B): −1.2 V; other conditions, same as FIG. 15.
Figure 16B:
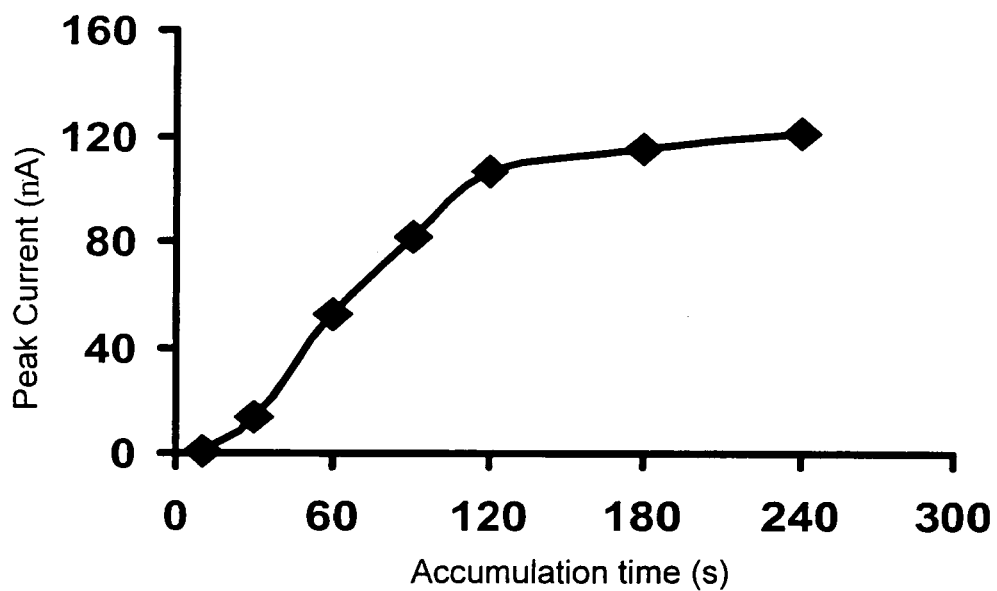

The parameters of voltammetric analysis, which affect the stripping signal of target metal ions, is optimized by using cadmium ion as model. FIG. 16 shows the effect of accumulation potentials and accumulation time upon the stripping signals for 5 μg/L cadmium. The accumulation potential has a strong effect on the SWV signal of cadmium. The stripping signal increased significantly in the interval from -0.9 to -1.0 V, then more slowly in the region up to -1.4 V (A). The stripping signal of cadmium increases with the increase of accumulation time, levels of above 120 seconds (B). The reason is a limited working area of the CNT tip on the electrode surface. No significant signals for analytes were observed without the deposition period. A longer accumulation time (for example, 4 minutes) was used to sufficiently accumulate the metal ions to a detectable level, but only for a very low target metal concentration (0.1 μg/L).

Figure 17:
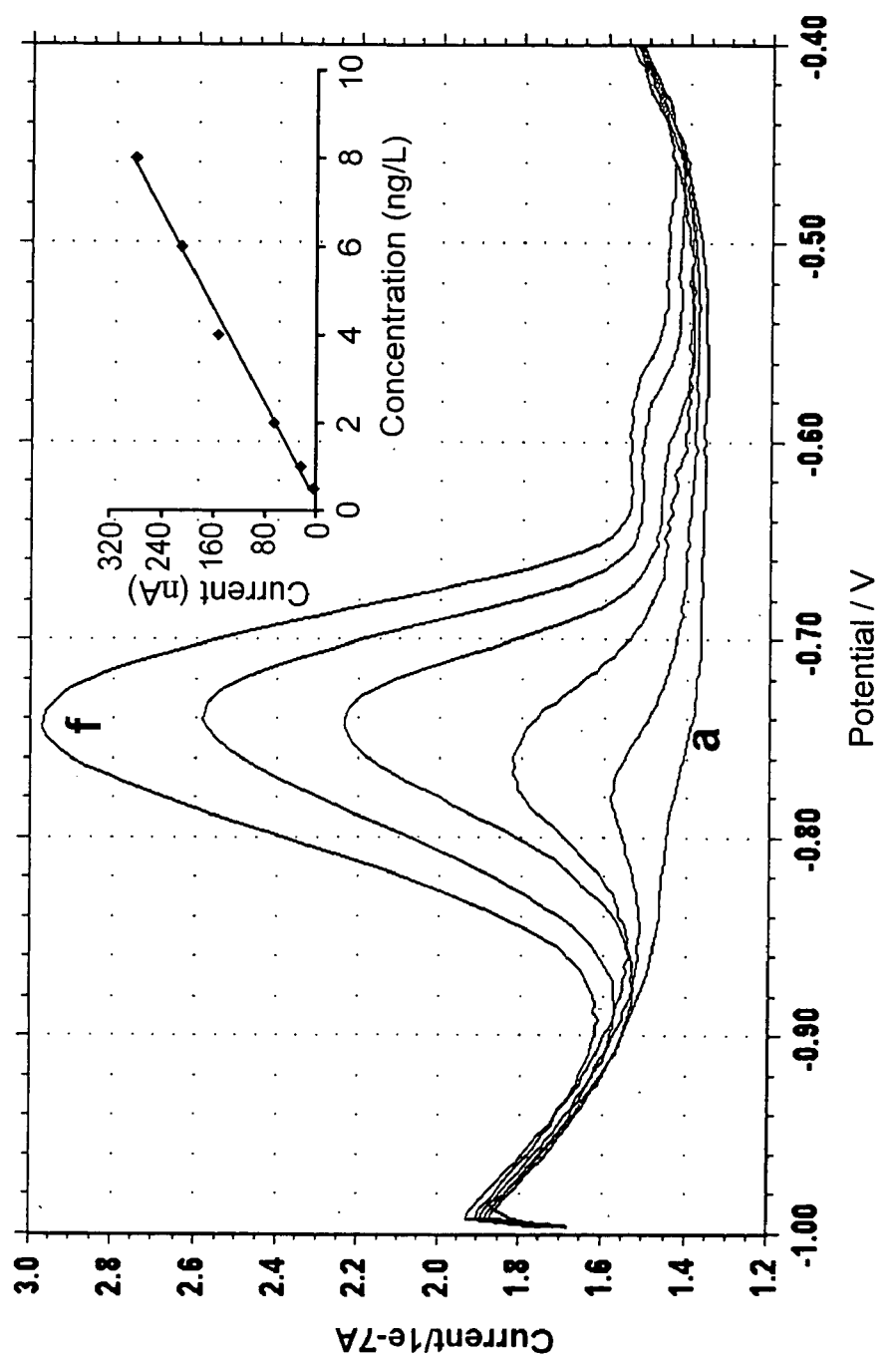
FIG. 17 shows square wave voltammetry characteristics for increasing the concentration of cadmium (0.5, 1, 2, 4, 6, 8 μg/L). Also shown (inset), the resulting calibration plot. Other conditions, same as FIG. 15.

FIG. 17 displays the SWV response of aligned nanotube NEA for increasing cadmium ion concentrations under the optimum experimental conditions. Well-defined peaks, proportional to the concentration of the corresponding cadmium, is observed. A small shoulder peak at -0.57 V was observed, which is attributed to a trace of lead in the blank solution. A linear relationship between the stripping current and cadmium concentration is obtained covering the concentration range from 0.5 μg/L to 8 μg/L, the linear regression equation being I (nA)=37.054C-10.486, with a correlation coefficient of 0.9955. The detection limit is improved significantly by increasing the accumulation time. A detection limit of 0.04 μg/L (40 ppt) is estimated on the basis of an s/n=3 characteristic of the 0.1 μg/L data points in connection with a 240-sec accumulation time. The detection limit obtained is much lower than that reported so far with a glassy carbon electrode. A series of six repetitive measurements of a solution containing 5 μg/L yielded a reproducible cadmium peak with relative standard deviations of 3.8.

Figure 18A:
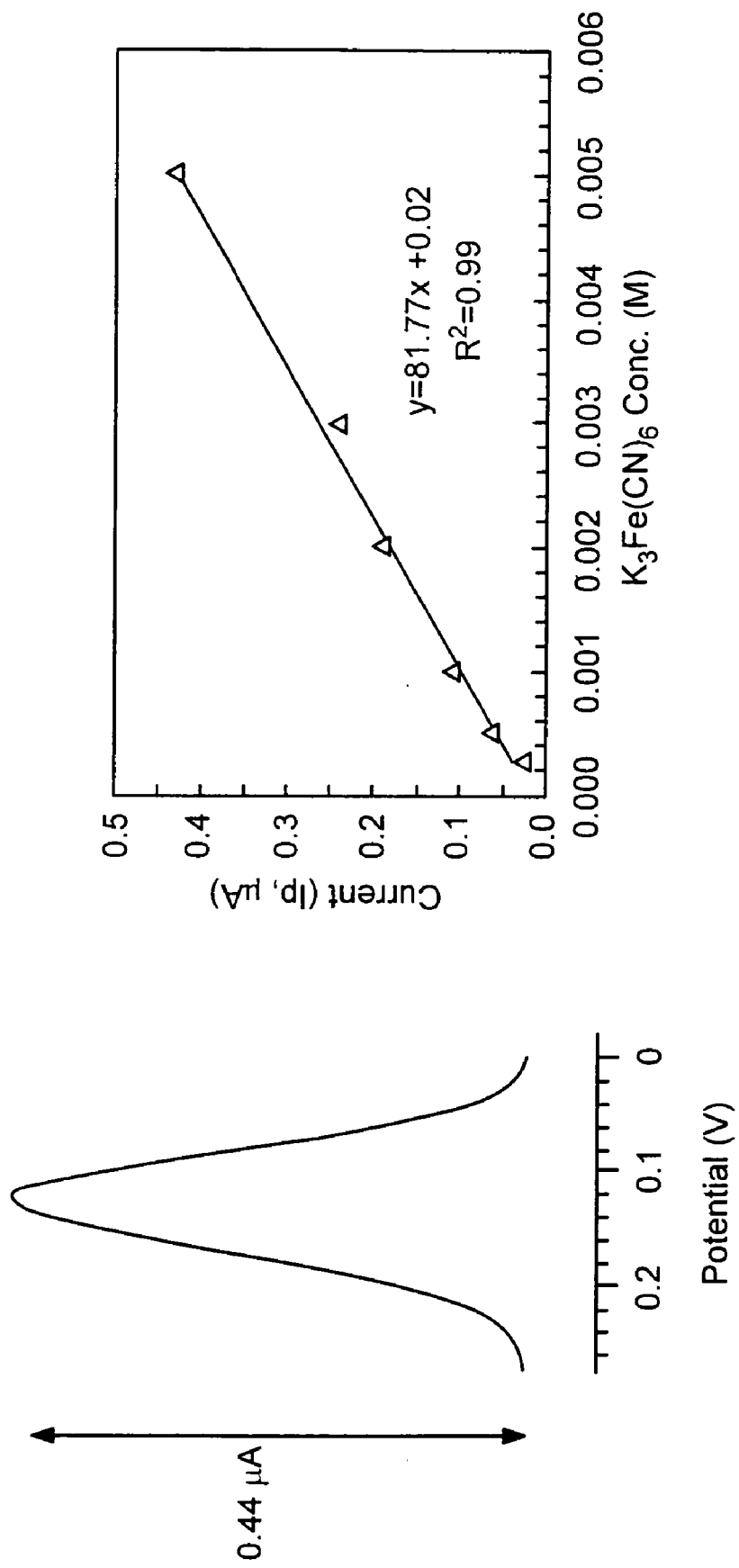
FIG. 18(a) shows the curve taken in solution of 5 mM $K_3Fe(CN)_6$ in 0.2 M $KNO_3$.
Figure 18B:
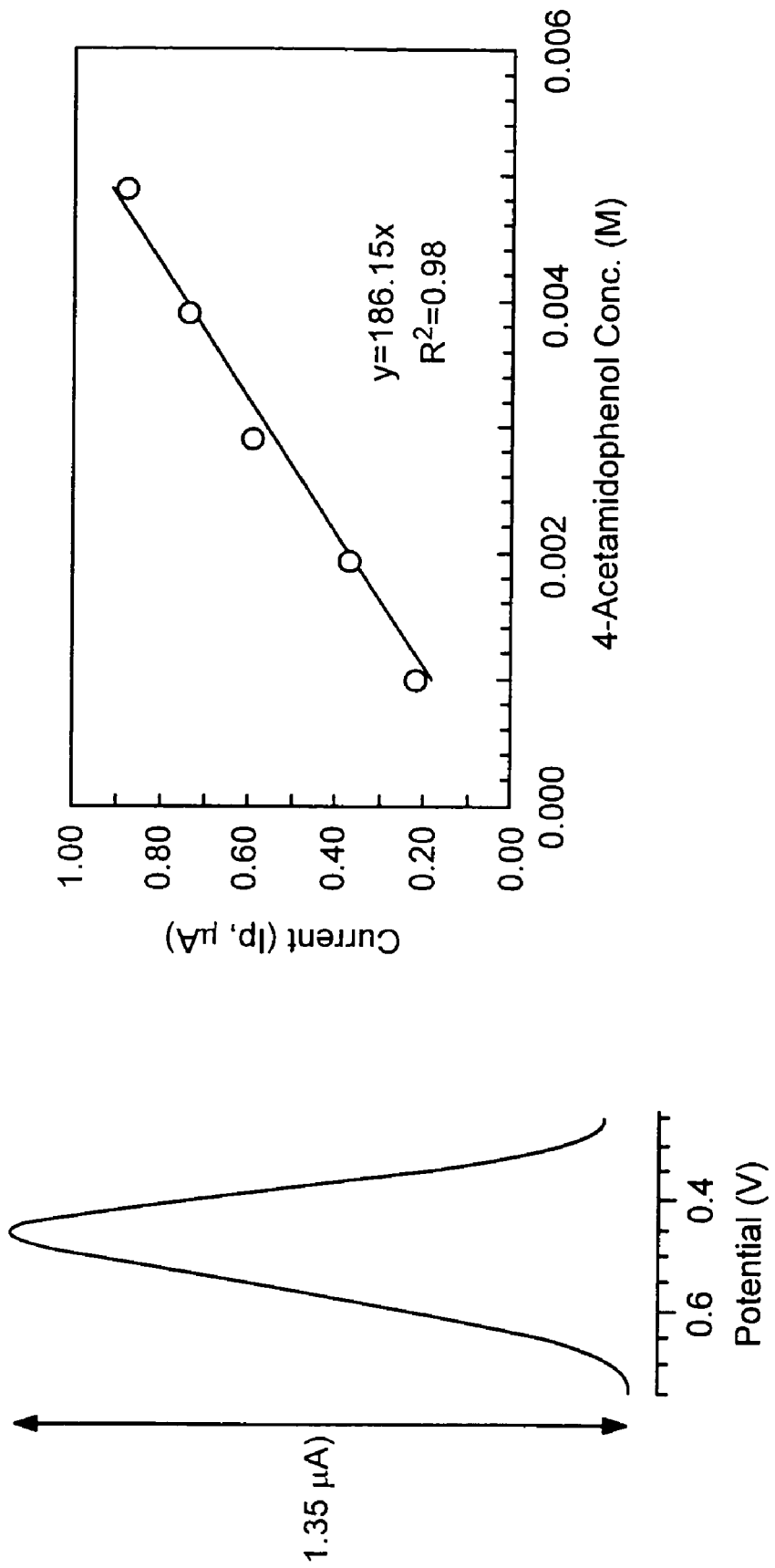
FIG. 18(b) shows the curve taken in solution of 10 mM 4-acetamidophenol in 0.2 M $KNO_3$. Pulse amplitude, 25 mV; step amplitude, 5 mV; frequency, 100 Hz. The horizontal axis represents length of potential (V). The vertical axis represents current.

FIG. 18(a) shows evaluation of the NEAs using square wave voltammetry (SVWV), 5 mM $K_3Fe(CN)_6$ in 0.2 M $KNO_3$ solution and the calibration curve. FIG. 18(b) shows the square wave voltammogram of 10 mM 4-acetamidophenol in 0.2 M $KNO_3$ solution and the calibration curve. Both voltammograms show a well-defined peak shape where the anodic peaks of $K_3Fe(CN)_6$ and 4-acetamidophenol are found at 0.12 V and 0.45 V, respectively. The peak currents are proportional to the analyte concentration in the solution. These results indicate the feasibility of using the CNTs-NEAs as a general platform for sensitive electrochemical sensing of electroactive analytes using SWV.

The CNTs materials having controlled site densities are suitable for use in nanoelectrode arrays (NEAs), as is evident from FIGS. 13, 15, 17 and 18. The CNT-NEAs of the present invention can be used for analytical purposes in which charging background current needs to be dramatically reduced, such as for example, metal ion detection in environmental analysis devices and as biosensors. NEAs can also be used as templates to fabricate other metal NEAs.

Lead is increasingly found in drinking water in many parts of the world stemming from industrial processes as well as geochemical mechanisms, it is regarded as highly toxic metal ions to a wide variety of organs in both humans and animals, including nervous, immune, reproductive, gastrointestinal systems. The ability to rapidly detect a trace amount of lead ($Pb^{2+}$) species on-site is very desirable.

Another aspect of the invention relates to using the NEAs of the present invention as ultrasensitive electrochemical sensors for chemical and biological sensing. In one preferred embodiment, the NEAs of the present invention are used for detection of trace amounts of lead (II) ion. Square wave voltammetric analysis of $Pb^{2+}$ is performed on a CHI 1232 electrochemical analyzer (CHI Instruments, Inc.). All solutions are degassed for a few minutes by passing through $N_2$ gas. In the stripping analysis, the NEAs are deposited with Hg before the detection of $Pb^{2+}$ using the conditions of: 5 ppm $Hg^{2+}$ in 0.1 M $NaNO_3$, and a potential of $-1.1$ V applied for a 5 minute period. Then the electrodes are rinsed with ultra pure water. The detection of $Pb^{2+}$ is a two-step process. The first step is the electrodeposition of $Pb^{2+}$ onto the nanoelectrodes, a negative potential of $-1.1$ V is applied to the electrodes that are immersed in $Pb^{2+}$ solutions with 0.1 M $NaNO_3$ as supporting electrolyte for a specified period of time (e.g., 1 to 10 minutes) under the stirred conditions, followed by a 10 second quiet period. In the detection step, the potential is scanned from $-1.1$ V to $-0.1$ V in the same solution under quiet conditions. The response peak of lead appeared at $-0.45$ V (vs. Ag/AgCl). Once the Hg film is deposited on the CNTs-NEAs, the electrode arrays can be used to detect the $Pb^{2+}$ solutions with varied concentrations (incrementally from 2 to 100 ppb) or varied deposition periods without redeposition of Hg film and surface regeneration.

Figure 19A:
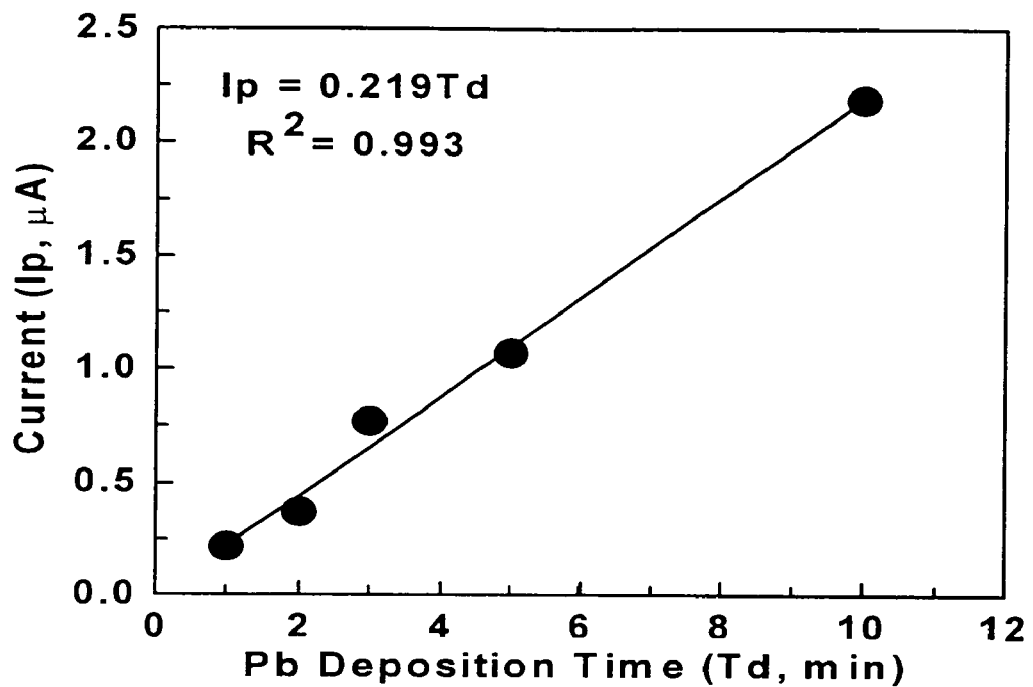
FIG. 19(a) shows the voltammetric response as a function of deposition time, measured with 5 ppb $Pb^{2+}$.
Figure 19B:
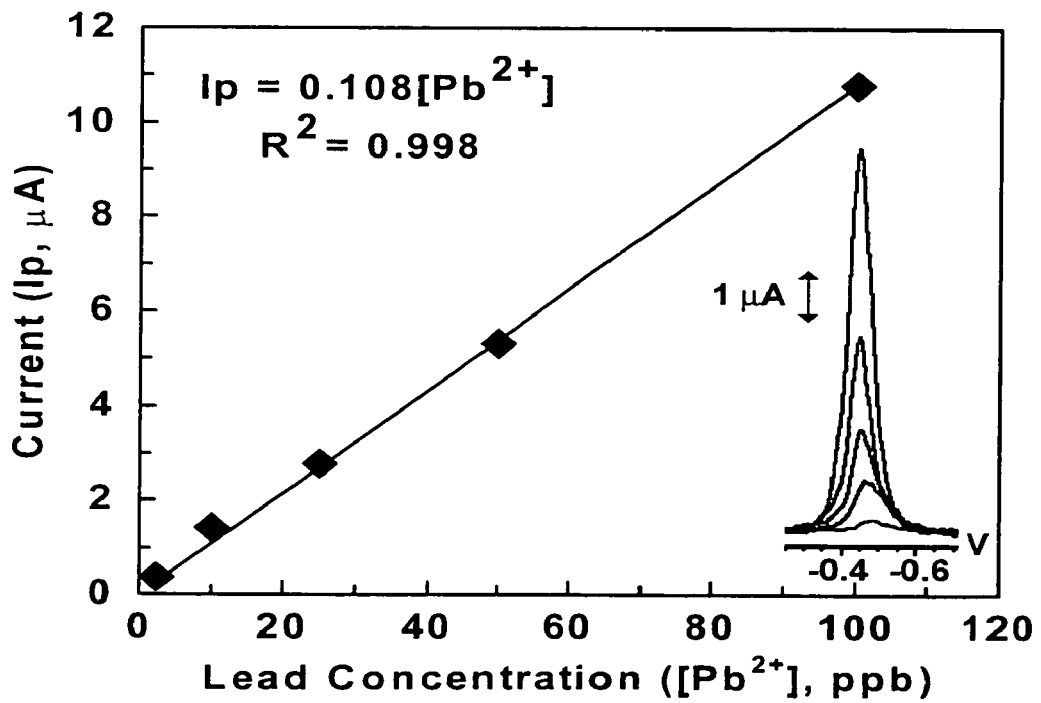
FIG. 19(b) shows the voltammetric response as a function of $Pb^{2+}$ concentration, measured after 3 minutes deposition. Pulse amplitude, 25 mV; step amplitude, 5 mV; frequency, 100 Hz. The voltammograms correspond to $Pb^{2+}$ concentration of 2, 5, 25, 50, and 100 ppb.

FIG. 19(a) shows the effect of deposition time of 5 ppb $Pb^{2+}$ in 0.1 M $NaNO_3$ solution, the voltammetric response (current) of lead is a linear function of the deposition time ranging for 1 to 10 minutes. FIG. 19(b) shows the voltammetric response is a linear function of $Pb^{2+}$ concentrations ranging from 2 to 100 ppb, the right inset is the response peaks of 2 to 100 ppb $Pb^{2+}$ after 3 minutes of deposition. At 25 ppb $Pb^{2+}$ and 3 minutes deposition time, the average response (current) is 2.78 µA, and the % RSD is 2.75 (n=5). Detection limit of $Pb^{2+}$ is 1 ppb after a 3-min preconcentration period.

The effect of electrolyte concentration on square wave-stripping analysis is also evaluated with NEAs of the present invention and a glassy carbon (GC) electrode (3 mm i.d.). At 0.1 M $NaNO_3$ electrolyte solution, well-defined voltammograms for $Pb^{2+}$ are obtained for both the NEAs of the present invention and GC electrode. The current ratio of GC/NEAs is about 10 for 100 ppb $Pb^{2+}$ in 0.1 M $NaNO_3$ electrolyte solution. When the electrolyte concentration is decreased to $10^{-4}$ M $NaNO_3$, the peak-shape of $Pb^{2+}$ in the voltammograms obtained with the NEAs of the present invention is still well-defined, whereas the peak-shape in the voltammograms obtained with the GC electrode is distorted and peak current decreases significantly. The small size of the total electrode surface of the NEAs of the present invention results in a much smaller current (i) than that obtained using the GC electrode. Ohmic drops ($-iR$) as a result of current flowing though solution generates a potential that opposes the applied potential. For the NEAs of the present invention, since the current (i) is relatively small, the ohmic drop is not large even at large resistance (R) in the highly resistive solutions (i.e., aqueous solution with extremely low concentration electrolyte). This allows the NEAs of the present invention to be operated under very low electrolyte conditions. Low electrolyte conditions are often desirable because: (1) high ionic strength can affect the activities and the mobilities of ions, (2) the interactions between the supporting electrolyte and the analyte can be significant and undesirable, and (3) adding supporting electrolyte is time-consuming and may introduce impurities.

In another aspect, the NEAs of the present invention can be used in promoting the redox reactions of hydrogen peroxide and nicotinamide adenine dinucleotide (NADH), which are involved in a wide range of amperometric biosensors associated with oxidase and dehydrogenase enzymes, such as those for cholesterol, alcohol, organophosphorous compounds, lactate, acetylcholine, choline, hypoxanthine, xanthine and glucose.

In one preferred embodiment, the NEAs of the present invention are used for the fabrication of glucose biosensors for a variety of heterogeneous test samples (e.g., saliva, sweat, urine, serum). Novel features of the glucose biosensors of the present invention include: selective electrochemical analysis of glucose in the presence of common interferents (e.g., acetaminophen, uric and ascorbic acids), avoiding the generation of an overlapping signal from such interferers, and elimination of the need for permselective membrane barriers or artificial electron mediators, thus simplifying the sensor design and fabrication.

Figure 20A:
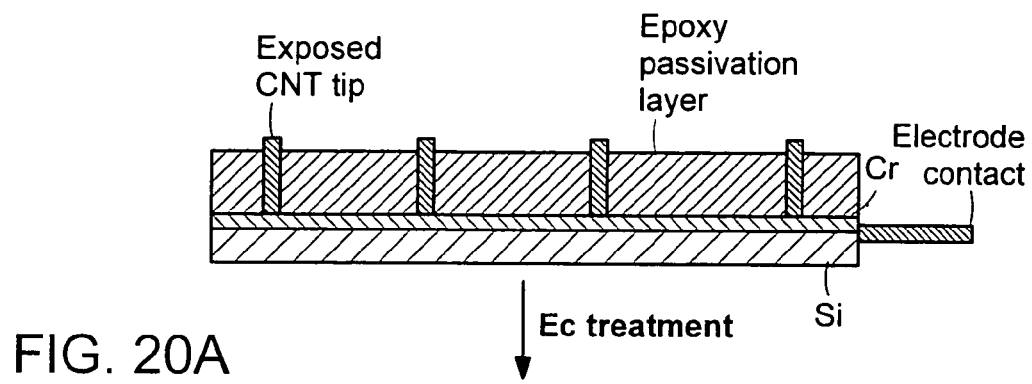
FIG. 20 shows the fabrication of a glucose biosensor of the present invention based on a CNT nanoelectrode array of the present invention. Electrochemical treatment of the CNT nanoelectrode array for functionalization is shown in step (A). Coupling of the enzyme glucose oxidase (GOx) to the functionalized CNT nanoelectrode array is shown in step (B).
Figure 20B:
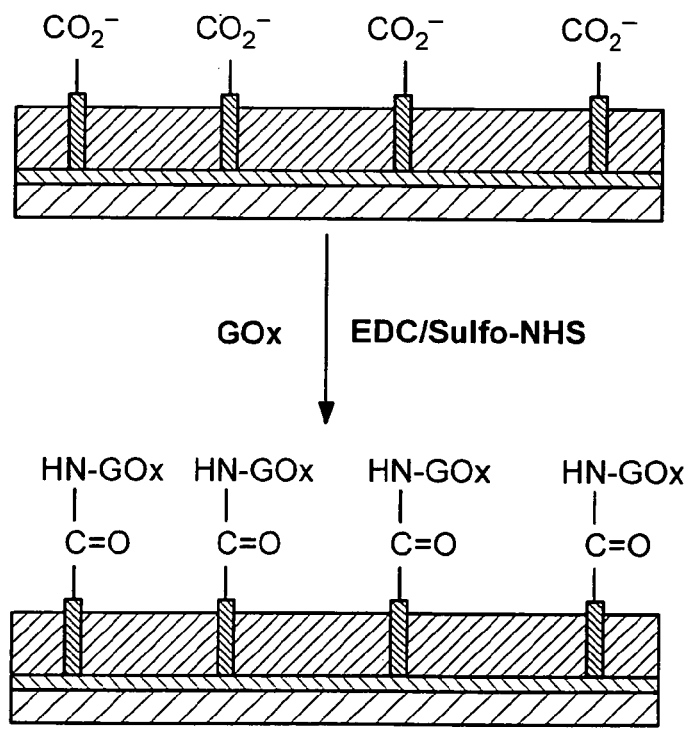

FIG. 20 is a schematic representing one embodiment of the fabrication procedure of the glucose biosensor of the present invention. After fabrication of the NEAs (as shown in FIG. 10), glucose oxidase is attached to the broken tips of the CNT using standard water-soluble coupling agents 1-ethyl-3-(3-dimethylaminopropyl)carbodiimide (EDC) and N-hydroxy-sulfo-succinimide (sulfo-NHS) by forming amide linkages between their amine residues and carboxylic acid groups on the CNT tips. Electrochemical treatment of the CNT nanoelectrode array for functionalization is shown in step (A). Coupling of the enzyme glucose oxidase (GOx) to the functionalized CNT nanoelectrode array is shown in step (B).

Figure 21:
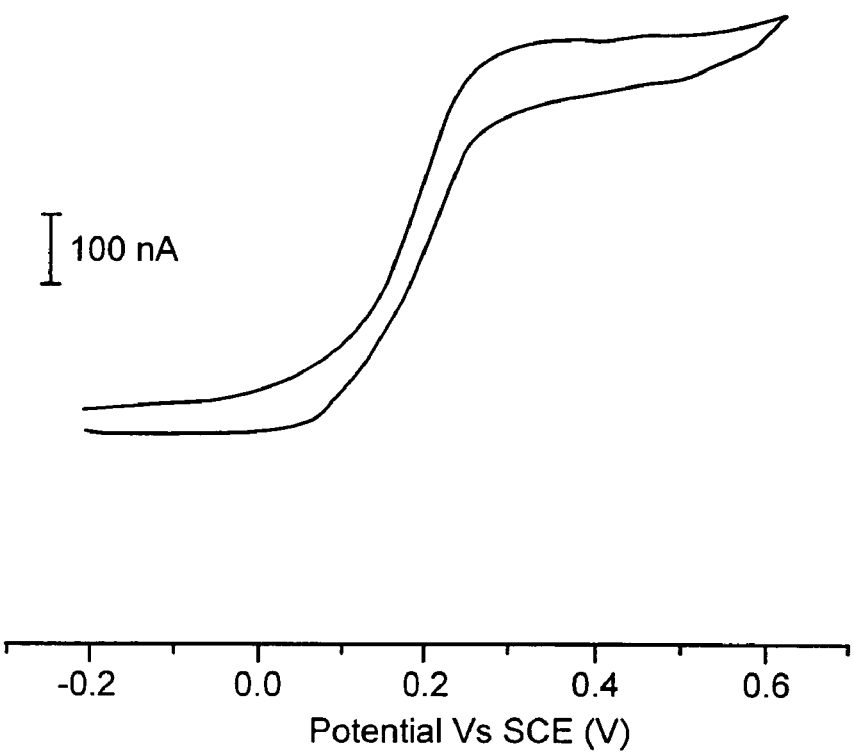
FIG. 21 shows a cyclic voltammetry curve of the glucose biosensor of the present invention taken in a solution of 4 mM $K_3Fe(CN)_6$ in 0.5 M $KNO_3$ at a 100 mV/s scan rate.

FIG. 21 shows the electrochemical characterization of the glucose biosensor. Electrochemical characterization is performed with a hand-held electrochemical detector (CHI Instruments, Inc., CHI 1232) connected to a portable computer. The amperometric experiment was performed in a standard single-compartment electrochemical cell that contained a glucose biosensor of the present invention, an Ag/AgCl reference electrode, and a platinum wire auxiliary electrode. The background response to the glucose biosensor of the present invention was allowed to decay to a steady state with stirring. When the background current became stable, a solution of glucose was injected into the electrolytic cell, and its response was measured. FIG. 21 shows the cyclic voltammogram, with the sigmoidal shape indicating nanoelectrode behavior. This indicates that there is no diffusion layer overlapping between the nanoelectrodes because most of the CNTs are separated from their nearest neighbors by at least 5 µm, which is much larger than the diameter of each nanotube (about 50 to about 80 nm). Very low background current and leakage current are the result of the excellent sealing provided by the spin-coated Epon epoxy resin, which enables the sensitive analysis.

Figure 22:
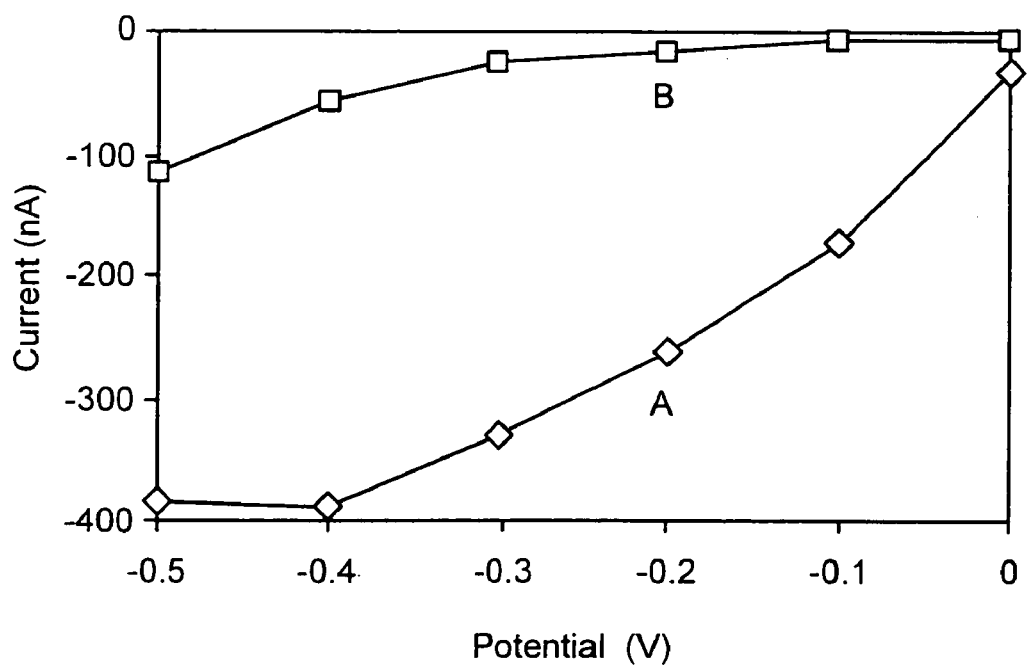
FIG. 22 shows a hydrodynamic voltammetry curve for 1 mM hydrogen peroxide at a glucose biosensor of the present invention (A) and at a glassy carbon electrode (B). The electrolyte and 0.1 M phosphate buffer (pH 7.4) were stirred at 300 rpm.

FIG. 22 illustrates a comparison of hydrodynamic voltammograms for 1 mM hydrogen peroxide using the glucose biosensors of the present invention (shown as A) and at a normal glassy carbon electrode (shown as B). The normal glassy carbon electrode generated only small cathodic responses, whereas the glucose biosensor of the present invention generated a significant catalytic reduction current. FIG. 22 shows that the range of operation potential for the glucose biosensor of the present invention is relatively broad. An optimal potential region (0 to −0.20 V) was chosen for this particular study. At such a low applied potential, the responses of common interference species can be minimized, and the oxygen reduction current can be limited.

Figure 23A:
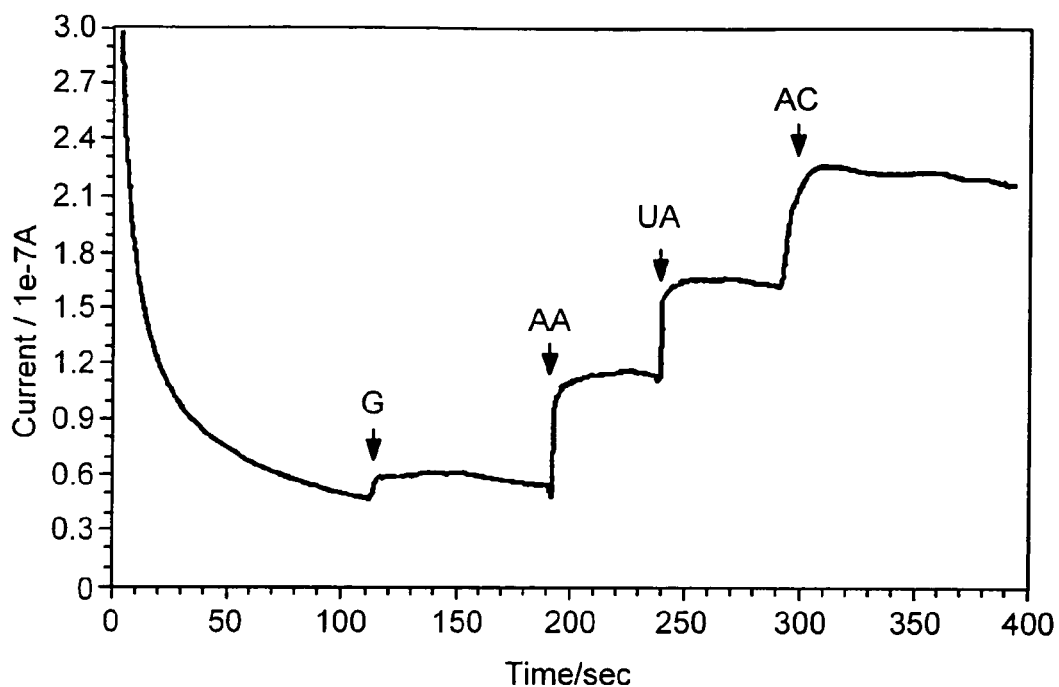
FIG. 23 shows amperometric responses of the glucose biosensor of the present invention to glucose (G), ascorbic acid (AA), uric acid (UA), and acetaminophen (AC) at potentials of +0.4 V (FIG. 23(a)) and −0.2 V (FIG. 23(b)).
Figure 23B:
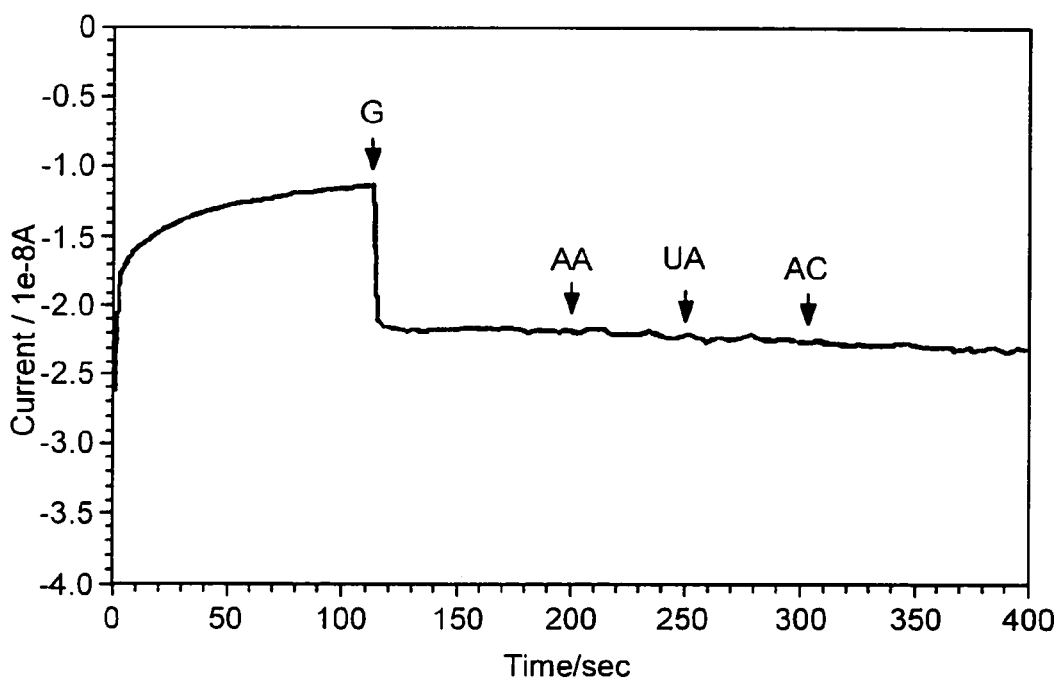

FIG. 23 compares amperometric responses for relevant physiological levels of glucose, ascorbic acid, acetaminophen, and uric acid at the GOx-modified NEAs at potentials of +0.4 V (as shown in FIG. 23(a)) and −0.2 V (as shown in FIG. 23(b)). Amperometric responses were obtained by a batch addition of interference species (0.5 mM ascorbic acid (AA), 0.5 mM uric acid (UA), and 0.5 mM acetaminophen (AC)) after the 5 mM glucose addition (G) at two different potentials +0.4 V (as shown in FIG. 23(a)) and −0.2 V (as shown in FIG. 23(b)). Well-defined cathodic and anodic glucose responses were obtained using the glucose biosensor of the present invention at potentials of +0.4 and 0.2 V. At an operating potential of +0.40 V, the glucose response is overlapped by large anodic contributions from ascorbic acid, uric acid, and acetaminophen. The use of a lower operating potential greatly reduces these contributions. No interference was observed at a potential of −0.2 V for the interference species, indicating high selectivity toward the glucose substrate. This illustrates that such a highly selective response to glucose is obtained with the glucose biosensor of the present invention without the use of mediators and permselective membranes.

Figure 24:
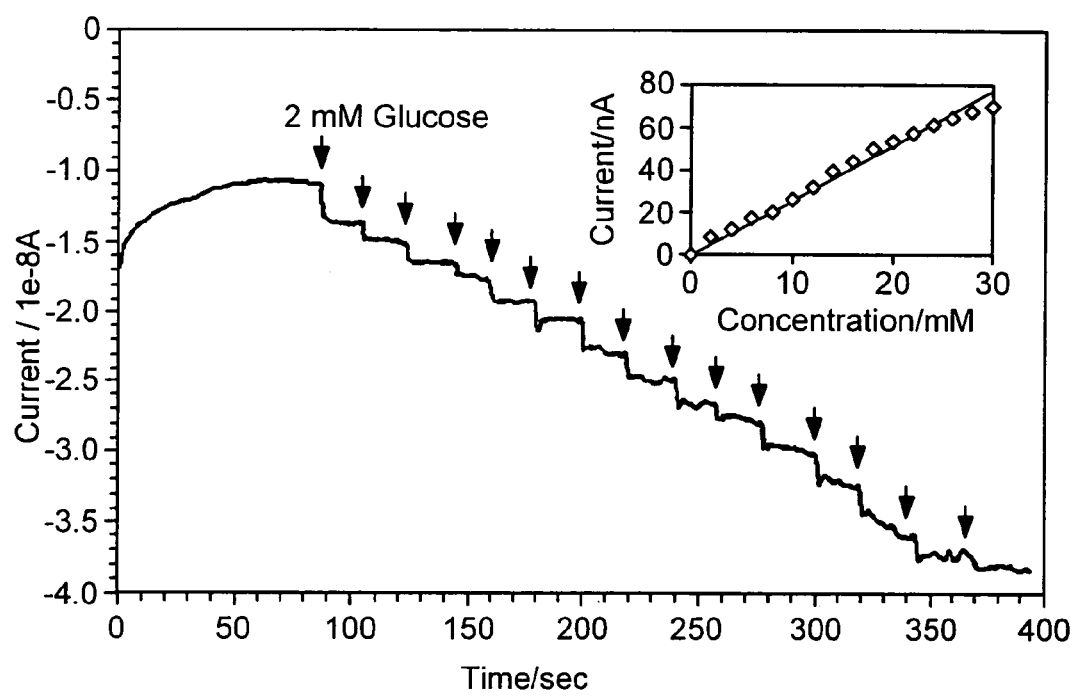
FIG. 24 shows amperometric responses of the glucose biosensor of the present invention to successive additions of 2 mM glucose.

FIG. 24 shows the amperometric responses of the glucose biosensor of the present invention for each successive addition of $2 \times 10^{-3}$ M glucose; the inset is the calibration curve. Well-defined current responses for glucose were obtained using the glucose biosensor of the present invention. The reaction occurring at the glucose biosensor of the present invention is very fast in reaching a dynamic equilibrium upon each addition of the sample solution, generating a steady-state current signal within 20 to 30 s. The linear response of the glucose biosensor of the present invention to glucose is up to about 30 mM of glucose, which is higher than the 15 mM required for practical use in the detection of blood glucose. The signal response curve is effective at low detection limits for glucose because of favorable signal-to-noise ratio characteristics at −0.2 V. The limit of detection, based on signal-to-noise ratio of 3, was 0.08 mM.

The CNT materials of the present invention having controlled site densities, and their method of manufacture, provides a method of controlling the shielding effect between individual tubules for field emission devices and microelectrode fabrication.

CNTs-produced according to the present invention can also be utilized to form composites with other materials, especially dissimilar materials. Suitable dissimilar materials include metals, ceramics, glasses, polymers, graphite, and mixtures thereof. Such composites may be prepared, for example, by coating the products of the present invention with these dissimilar materials either in a solid particulate form or in a liquid form. A variety of polymers, including thermoplastics and resins can be utilized to form composites with the products of the present invention. Such polymers include, for example polyamides, polyesters, polyethers, polyphenylenes, polysulfones, polyurethanes or epoxy resins.

In one aspect, the invention provides a method for detecting an amount of a metal ion in an aqueous solution including providing an array of substantially linear carbon nanotubes, each of the carbon nanotubes having a proximal end attached to a surface of a catalyst substrate material that has at least one electrically insulating layer on the surface as well as a metal wire attached to the surface of the substrate and a distal end that is exposed; providing a reference and auxiliary electrode; introducing the aqueous solution comprising a metal ion to the array of substantially linear carbon nanotubes; measuring an amperometric response of the array of substantially linear carbon nanotubes to the aqueous solution; and detecting the amount of metal ion in the aqueous solution.

In another aspect, the invention provides a method for detecting an amount of glucose in a test sample including providing an array of substantially linear carbon nanotubes, each of the carbon nanotubes having a proximal end attached to a surface of a catalyst substrate material that has at least one electrically insulating layer on the surface as well as a metal wire attached to the surface of the substrate and a functional group and enzyme for detecting glucose attached to a distal end of each of the carbon nanotubes; providing a reference and auxiliary electrode; introducing a test sample comprising a solution of glucose to the array of substantially linear carbon nanotubes; measuring an amperometric response of the array of substantially linear carbon nanotubes to the test sample; and detecting the amount of glucose in the test sample.

The invention is illustrated by the following examples, which are not intended to be limiting in any way.

EXAMPLES

Example 1

Formation of Ni Microparticles Onto a Substrate By Current Electrochemical Deposition The current electrochemical deposition is carried out on a two electrode system. The working electrode is prepared by sputtering a layer of chromium (Cr) onto a silicon (Si) wafer forming a flat, conductive and defect free surface. Gold plate is used as counter electrode. A bath solution of about 0.01 M nickel sulfate ($NiSO_4$) and about 0.01 M boric acid ($H_3BO_3$) in double distilled water is prepared. The solution is weakly acidic. About 1 $cm^2$ of the working electrode surface is exposed to the solution. The distance between the two electrodes is kept at about 1 cm. The chemicals are preferably reagent grade from Aldrich and used as received. A constant current pulse is applied by using a current source and a voltage source. Both the current source and the voltage source are controlled by a computer program. The current electrochemical deposition is at room temperature. The working electrode having deposited nickel (Ni) microparticles is then used as a substrate to form aligned carbon nanotubes.

Example 2

Growth of CNTs using PECVD

The substrate having Ni microparticles, as described in Example 1, is loaded into a PECVD system described by Z. F. Ren, et al., *Science*, 282, 110[5] (1998); Z. P. Huang, et al., *Appl. Phys. A: Mater. Sci. Process*, 74, 387 (2002); and Z. F. Ren et al., *Appl. Phys. Lett.*, 75, 1086 (1999), the contents of which are incorporated herein by reference in their entirety.

The pressure in the system is pumped down to about $2 \times 10^{-6}$ Torr. About 160 standard cubic centimeter per minute (sccm) ammonia ($NH_3$) gas is then introduced into the chamber and the temperature is increased by applying current on the tungsten (W) filament. About 100 Watts DC plasma is applied for about 10 to about 20 seconds first to pre-etch the nickel (Ni) microparticles, then about 40 sccm acetylene ($C_2H_2$) gas is introduced and the plasma intensity is increased to about 170 W for the aligned CNTs growth. The pressure during growth is kept at about 15 Torr. Both acetylene and ammonia preferably have a minimum purity of about 99.99%. The CNTs growth time is about 5 minutes, and the sample temperature during growth is below about 660° C.

Example 3

Growth of Aligned CNTs Arrays

Ni microparticles are randomly electrodeposited on 1 cm² Cr-coated silicon (Si) substrate by applying pulse current to the substrate in $NiSO_4$ electrolyte solution. The size and the site density of the Ni microparticles are controlled by the amplitude and the duration of the pulse current. CNTs growth is performed in the plasma enhanced chemical vapor deposition (PECVD) system at temperature of 650° C. for 8 minutes with 160 sccm ammonia ($NH_3$) gas and 40 sccm acetylene ($C_2H_2$) gas with a total pressure of 15 Torr and plasma intensity of 170 Watts. The CNTs are about 8 μm in length and about 100 nm in diameter. The average spacing between nanotubes is about 10 μm that corresponds to a site density of $10^6$ cm$^{-2}$.

Example 4

Analysis of CNTs

Scanning electron microscopy (SEM, JEOL JSM-6340F) is employed to examine the CNTs morphology. Transmission electron microscopy (TEM, JEOL 2010) is used to characterize the structure of the CNTs by standard methods.

Example 5

Fabrication of Carbon Nanotubes Nanoelectrode Arrays (NEAs)

After growth of CNTs using PECVD, as described in Example 3, a 2-gram quantity of the epoxy resin Epon 828 is weighed into a small glass vial and the vial is placed into a 70° C. water bath. At this temperature, the viscosity of Epon 828 decreases dramatically but is still too high for the spin coating. A 2.5 mL volume of tetrahydrofuran (THF) is added to further reduce the viscosity of the resin. Then 0.28 grams (14 wt. %) of MPDA hardener is added to the stirred resin. After 2 to 3 minutes, 0.15 mL of the epoxy mixture is dropped on the aligned CNTs on the Si substrate. The CNTs substrate is pre-heated on a hot plate at 70° C. to maintain the viscosity of the epoxy mixture after it is dropped on the substrate. The substrate is then transferred to a spin-coater and spun at 7000 rpm for about 1 minute. The aligned CNTs maintain in vertical alignment after the resin-dropping and spin-coating processes. The sample is left in room temperature for one day, then heated (cured) in an oven at 90° C. for 1 hour, followed by a post cure at 150° C. for 1 to 2 days. After the curing processes, a uniform thin layer of epoxy resin (7-9 μm) is obtained on the substrate. The CNTs are half embedded in the resin with 2 to 3 μm protruding out. By using a lens paper to gently polish the sample, the protruding part of CNTs are broken and removed by ultrasonication in water. The electrical connection was then made on the CNT-Si substrate. Finally, the electrode arrays are pre-treated by electrochemical etching in 1.0 M NaOH at 1.5 V for 90 seconds prior to the electrochemical characterizations. The final nanoelectrodes produced have a diameter ranging from about 50 to about 80 nm. The CNT-NEAs fabricated based on this design effectively use the open ends of CNTs for electrochemical sensing. The open ends of the CNTs have fast electron transfer rates similar to a graphite edge-plane electrode, while the sidewalls present very slow electron transfer rates similar to the graphitic basal plane.

Example 6

Fabrication of An Electrochemical Sensing Device for the Detection of Metal Ions CNT-NEAs are prepared according to Example 5. Briefly, Ni nanoparticles are first electrodeposited on a Cr-coated Si substrate with an area of 1 cm². The aligned CNT arrays with low site density are subsequently grown from those Ni nanoparticles by plasma-enhanced chemical vapor deposition. The aligned CNT arrays have a site density of $1 \times 10^6$ to $3 \times 10^6$/cm², a length of 10 to 12 μm, and a diameter of 50 to 80 nm. An Epon epoxy resin 828 passivation layer (7 to 9 μm) is coated on the aligned CNT arrays to keep the CNT forest on the silicon substrate surface using a standard spin-coating technology. The aligned CNTs show very good mechanical properties and are maintained in vertical alignment. The CNTs are half embedded in the resin with 2 to 3 μm protruding out. By using a lens paper to gently polish the sample, the protruding parts of CNTs are broken and removed by ultrasonication in water. Then the electrical connection is made on the CNT-Si substrate. Finally, the electrode arrays are pre-treated by electrochemical etching in 1.0 M NaOH at 1.5 V for 90 seconds before the electrochemical characterizations. The final nanoelectrodes produced are the carbon nanoelectrodes with a diameter of 50 to 80 nm.

The CNT nanoelectrode is gently hand polished with lens paper, followed by sonication in Millipore Milli-Q water for 30 seconds. Square wave voltammetric (SWV) measurements of target metal ions is performed using an in situ prepared bismuth film on a CNT-NEA during a 30-sec pretreatment at 0.3 V followed by 2-min accumulation at −1.2 V in 10-mL 0.1 M acetate buffer (pH 4.5). Subsequent stripping is performed after a 10-sec rest period (without stirring) from −1.0 V to −0.4 V with a step potential of 5 mV, amplitude 20 mV, and frequency of 25 Hz.

Example 7

Fabrication of A Glucose Biosensor

The CNT nanoelectrode array is pretreated in 1.0 M NaOH at 1.5 V for 90 s. After electrochemical treatment, some functional groups (e.g., carboxylic acid) are created at the CNT tips. The activated CNT nanoelectrode array is immersed in a freshly prepared 10-mL aqueous solution of EDC (10 mg/mL). With stirring, 300 mg of sulfo-NHS is added to the solution. The pH of the solution is adjusted to 7. The reaction is allowed to occur at room temperature for 2 h. Then, the CNT nanoelectrode array is washed with cold water and immersed into a degassed solution (10 mL) with the desired amount of glucose oxidase (GOx) (2 mg/mL) in a 0.1 M, pH 7.4 phosphate buffer solution (PBS) with stirring. The enzyme immobilization reaction is allowed to occur at room temperature for 2 h. The resultant glucose biosensor is washed with a 0.1 M phosphate buffer solution (pH 7.4) containing 0.5% BSA and stored at 4° C. before use (as described in Yuehe Lin, et al., *Nano Letters,* 4(2), 191 (2004), the contents of which are incorporated herein by reference in their entirety).

All patents, patent applications, and published references cited herein are hereby incorporated by reference in their entirety. While this invention has been particularly illustrated and described with references to particular examples of preferred embodiments thereof, it will be understood by those skilled in the art that various changes in form and details may be made therein without departing from the scope and spirit of the invention encompassed by the appended claims.

What is claimed is:

1. A nanoelectrode array comprising:
    a carbon nanotube material comprising an array of substantially linear carbon nanotubes each having a proximal end and a distal end, the proximal end of the carbon nanotubes are attached to a catalyst substrate material to form the array with a pre-determined site density, wherein the carbon nanotubes are aligned with respect to one another within the array;
    an electrically insulating layer on the surface of the carbon nanotube material, whereby the distal end of the carbon nanotubes extend beyond the electrically insulating layer;
    a second adhesive electrically insulating layer on the surface of the electrically insulating layer, whereby the distal end of the carbon nanotubes extend beyond the second adhesive electrically insulating layer; and
    a metal wire attached to the catalyst substrate material.

2. The nanoelectrode array of claim 1, wherein the electrically insulating layer comprises a metal oxide.

3. The nanoelectrode array of claim 2, wherein the metal oxide is silicon dioxide ($SiO_2$).

4. The nanoelectrode array of claim 1, wherein the second adhesive electrically insulating layer comprises a polished exterior surface.

5. The nanoelectrode array of claim 1, wherein the second adhesive electrically insulating layer comprises an epoxy-phenolic adhesive.

6. The nanoelectrode array of claim 1, wherein the array of substantially linear carbon nanotubes provide an electrochemical sensing device for the detection of a metal ion.

7. The nanoelectrode array of claim 6, wherein the metal ion is selected from the group consisting of lead, arsenic, copper, cadmium, zinc, chromium, mercury, uranium, bismuth, thallium, tin, antimony, tellurium, iodine, selenium, gold, silver, cobalt, nickel, thorium and plutonium.

8. The nanoelectrode array of claim 1, wherein the array of substantially linear carbon nanotubes provides an electrochemical sensing device for the detection of a drug.

9. The nanoelectrode array of claim 8, wherein the drug is selected from the group consisting of 4-acetamidophenol, carbonhydrates, insulin, cystein, hemocysteine, sulfide, phenolic compounds, choloramphenicol, myoglobin, 3,4-dihydroxyphenyacetic acid, hypoxanthine, ascorbic acid, uric acid, catechol, tryptophan, nitrite, L-dopa, dopamine, norepinephrine, and nitric oxide.

10. A nanoelectrode array for the selective detection of glucose comprising:
    a carbon nanotube material comprising an array of substantially linear carbon nanotubes each having a proximal end and a distal end, the proximal end attached to a catalyst substrate material to form the array with a pre-determined site density, and a carboxylic acid group functionalized to the distal end of the carbon nanotubes, wherein the carbon nanotubes are aligned with respect to one another within the array;
    an electrically insulating layer on the surface of the carbon nanotube material, whereby the distal end of the carbon nanotubes extend beyond the electrically insulating layer;
    a second adhesive electrically insulating layer on the surface of the electrically insulating layer, whereby the distal end of the carbon nanotubes extend beyond the second adhesive electrically insulating layer; and
    a metal wire attached to the catalyst substrate material, wherein the carboxylic acid group attached to the distal end of the carbon nanotubes is coupled to a glucose oxidase enzyme for the selective detection of glucose.

11. The nanoelectrode array of claim 10, wherein the catalyst substrate material comprises a non-metallic material having deposited thereupon a layer of a metallic material, and a plurality of catalytic transition metal microparticles deposited upon the metallic material with pre-determined densities.

12. The nano electrode array of claim 11, wherein the non-metallic material is a silicon wafer.

13. The nanoelectrode array of claim 11, wherein the metallic material is chromium (Cr).

14. The nanoelectrode array of claim 11, wherein the catalytic transition metal microparticles comprise nickel (Ni).

15. The nanoelectrode array of claim 10, with pre-determined densities of up to $1 \times 10^{12}$ $cm^{-2}$.

16. The nanoelectrode array of claim 10, wherein the electrically insulating layer comprises a metal oxide.

17. A nanoelectrode array for detecting a metal ion in a solution comprising:
    an array of vertically aligned carbon nanotubes having a pre-determined site density, wherein each carbon nanotube in the array has a proximal end and a distal end and wherein the proximal end of each carbon nanotube is attached to a metallic coating on a non-metallic substrate;
    an electrically insulating layer on a surface of the array of vertically aligned carbon nanotubes, whereby the electrically insulating layer insulates the metallic coating on the non-metallic substrate;
    a second adhesive electrically insulating layer surrounding the electrically insulating layer, whereby the second adhesive electrically insulating layer insulates the metallic coating on the non-metallic substrate and supports the array of vertically aligned carbon nanotubes; and an electrical connection attached to the substrate,
    wherein the distal end of each of the carbon nanotubes is exposed to electrochemically sense the metal ion in the solution.

18. The nanoelectrode array of claim 17 wherein each of the carbon nanotubes has a diameter ranging from about 50 nm to about 80 nm.

19. A nanoelectrode array for generating an amperometric response to at least one drug in a solution comprising:
    an array of vertically aligned carbon nanotubes having a pre-determined site density, wherein each carbon nanotube in the array has a proximal end and a distal functionalized end and wherein the proximal end of each carbon nanotube engages to a metallic coating on a non-metallic substrate, and wherein the distal functionalized end of each carbon nanotube is coupled to a glucose oxidase;
    an electrically insulating layer on a surface of the array of vertically aligned carbon nanotubes, whereby the electrically insulating layer insulates the metallic coating on the non-metallic substrate;
    a second adhesive electrically insulating layer surrounding the electrically insulating layer, whereby the second adhesive electrically insulating layer insulates the metallic coating on the non-metallic substrate and supports the array of vertically aligned carbon nanotubes; and an electrical connection attached to the substrate, wherein the glucose oxidase is capable of interacting with the at least one drug in the solution to generate an amperometric response.

20. The nanoelectrode array of claim 19 wherein the at least one drug is selected from the group consisting of 4-acetamidophenol, carbonhydrates, glucose, insulin, cystein, hemocysteine, sulfide, phenolic compounds, choloramphenicol, myoglobin, 3,4-dihydroxyphenyacetic acid, hypoxanthine, ascorbic acid, uric acid, catechol, tryptophan, nitrite, L-dopa, dopamine, norepinephrine, and nitric oxide.

* * * * *

UNITED STATES PATENT AND TRADEMARK OFFICE
CERTIFICATE OF CORRECTION

PATENT NO.        : 7,452,452 B2                                         Page 1 of 1
APPLICATION NO.   : 11/017480
DATED             : November 18, 2008
INVENTOR(S)       : Zhifeng Ren et al.

It is certified that error appears in the above-identified patent and that said Letters Patent is hereby corrected as shown below:

Title Pg, Item (73) Assignee: please add the following Assignee after The Trustees of Boston College, Chestnut Hill, MA (US):

-- Battelle Memorial Institute, Richland, WA (US) --

Signed and Sealed this

Twenty-fourth Day of March, 2009

JOHN DOLL
*Acting Director of the United States Patent and Trademark Office*